(12) United States Patent
Lin et al.

(10) Patent No.: US 10,510,580 B2
(45) Date of Patent: Dec. 17, 2019

(54) DUMMY FIN STRUCTURES AND METHODS OF FORMING SAME

(71) Applicant: Taiwan Semiconductor Manufacturing Company, Ltd., Hsinchu (TW)

(72) Inventors: Chin-Hsiang Lin, Hsinchu (TW); Keng-Chu Lin, Ping-Tung (TW); Shwang-Ming Jeng, Hsinchu (TW); Teng-Chun Tsai, Hsinchu (TW); Tsu-Hsiu Perng, Zhubei (TW); Fu-Ting Yen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/103,988

(22) Filed: Aug. 16, 2018

(65) Prior Publication Data

US 2019/0103304 A1 Apr. 4, 2019

Related U.S. Application Data

(60) Provisional application No. 62/566,045, filed on Sep. 29, 2017.

(51) Int. Cl.
| | | |
|---|---|---|
| *H01L 27/088* | (2006.01) | |
| *H01L 21/762* | (2006.01) | |
| *H01L 21/8238* | (2006.01) | |
| *H01L 27/092* | (2006.01) | |
| *H01L 29/66* | (2006.01) | |

(Continued)

(52) U.S. Cl.
CPC ......... *H01L 21/76229* (2013.01); *H01L 21/823431* (2013.01); *H01L 21/823821* (2013.01); *H01L 21/823878* (2013.01); *H01L 21/823892* (2013.01); *H01L 27/0924* (2013.01); *H01L 29/6681* (2013.01); *H01L 29/66545* (2013.01); *H01L 29/66795* (2013.01); *H01L 29/785* (2013.01)

(58) Field of Classification Search
USPC ....... 257/401, 57, 59, 72, 83, 257, 290, 351, 257/368, 392, 66, E21.7, E29.003, 257/E29.295; 438/30, 48, 128, 149, 151, 438/157, 161, 283
See application file for complete search history.

(56) References Cited

U.S. PATENT DOCUMENTS

| | | |
|---|---|---|
| 8,836,016 B2 | 9/2014 | Wu et al. |
| 8,841,701 B2 | 9/2014 | Lin et al. |

(Continued)

FOREIGN PATENT DOCUMENTS

TW 201715615 A 5/2017

*Primary Examiner* — Niki H Nguyen
(74) *Attorney, Agent, or Firm* — Slater Matsil, LLP

(57) ABSTRACT

An embodiment method includes depositing a first dielectric film over and along sidewalls of a semiconductor fin, the semiconductor fin extending upwards from a semiconductor substrate. The method further includes depositing a dielectric material over the first dielectric film; recessing the first dielectric film below a top surface of the semiconductor fin to define a dummy fin, the dummy fin comprising an upper portion of the dielectric material; and forming a gate stack over and along sidewalls of the semiconductor fin and the dummy fin.

20 Claims, 49 Drawing Sheets

(51) Int. Cl.
*H01L 29/78* (2006.01)
*H01L 21/8234* (2006.01)

(56) References Cited

U.S. PATENT DOCUMENTS

| | | |
|---|---|---|
| 8,847,293 B2 | 9/2014 | Lee et al. |
| 8,853,025 B2 | 10/2014 | Zhang et al. |
| 8,962,400 B2 | 2/2015 | Tsai et al. |
| 9,093,514 B2 | 7/2015 | Tsai et al. |
| 9,171,752 B1 | 10/2015 | Wu et al. |
| 9,236,267 B2 | 1/2016 | De et al. |
| 9,245,805 B2 | 1/2016 | Yeh et al. |
| 9,520,482 B1 | 12/2016 | Chang et al. |
| 9,576,814 B2 | 2/2017 | Wu et al. |
| 9,768,278 B1 * | 9/2017 | Chui ................... H01L 21/2652 |
| 2014/0312398 A1 * | 10/2014 | Ching ............... H01L 29/66795 257/288 |
| 2016/0043225 A1 * | 2/2016 | Ching ................ H01L 29/1054 257/401 |
| 2016/0284695 A1 * | 9/2016 | Liaw ..................... H01L 27/088 |
| 2017/0133487 A1 | 5/2017 | Chiang et al. |
| 2019/0027603 A1 * | 1/2019 | Cheng ................ H01L 29/7846 |

* cited by examiner

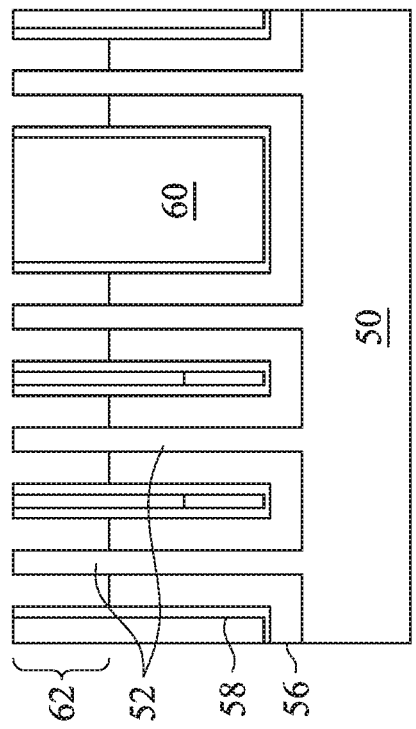
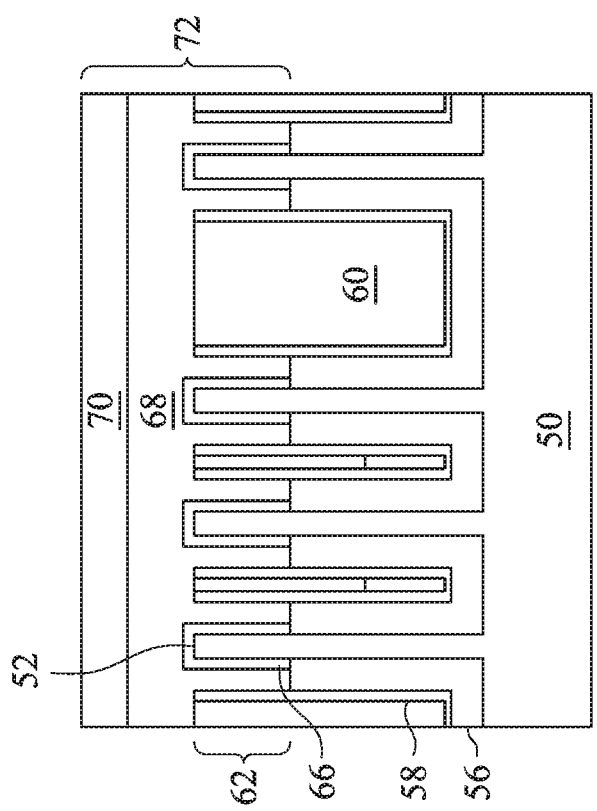
Fig. 11A
Fig. 11B

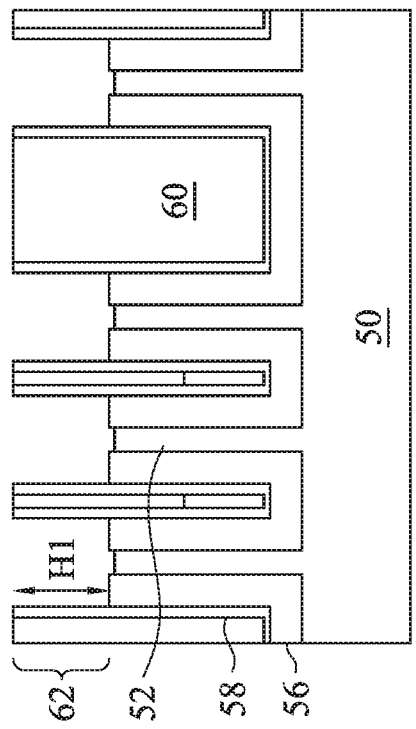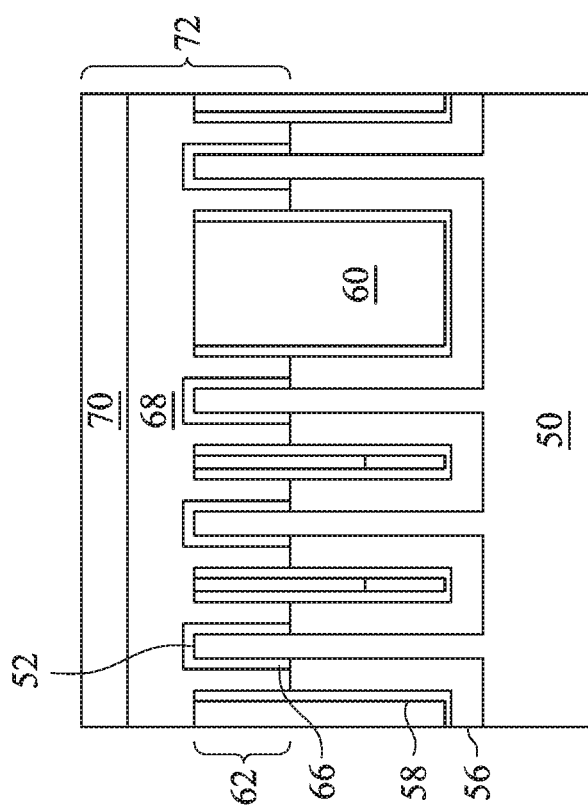
Fig. 13B
Fig. 13A

DUMMY FIN STRUCTURES AND METHODS OF FORMING SAME

PRIORITY CLAIM AND CROSS-REFERENCE

This patent application claims priority to U.S. Provisional Application No. 62/566,045, filed on Sep. 29, 2017 and entitled "Dummy Fin Structures and Methods of Forming Same," which application is hereby incorporated by reference herein as if reproduced in its entirety.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6, 7A, 7B, 8, 9, 10A, 10B, 10C, 11A, 11B, 11C, 11D, 12A, 12B, 12C, 13A, 13B, 13C, 14A, 14B, 14C, 14D, 15A, 15B, 15C, 16A, 16B, 16C, 17A, 17B, and 17C illustrate varying views of intermediary stages of manufacturing a device in accordance with some embodiments.

DETAILED DESCRIPTION

Figure 1:
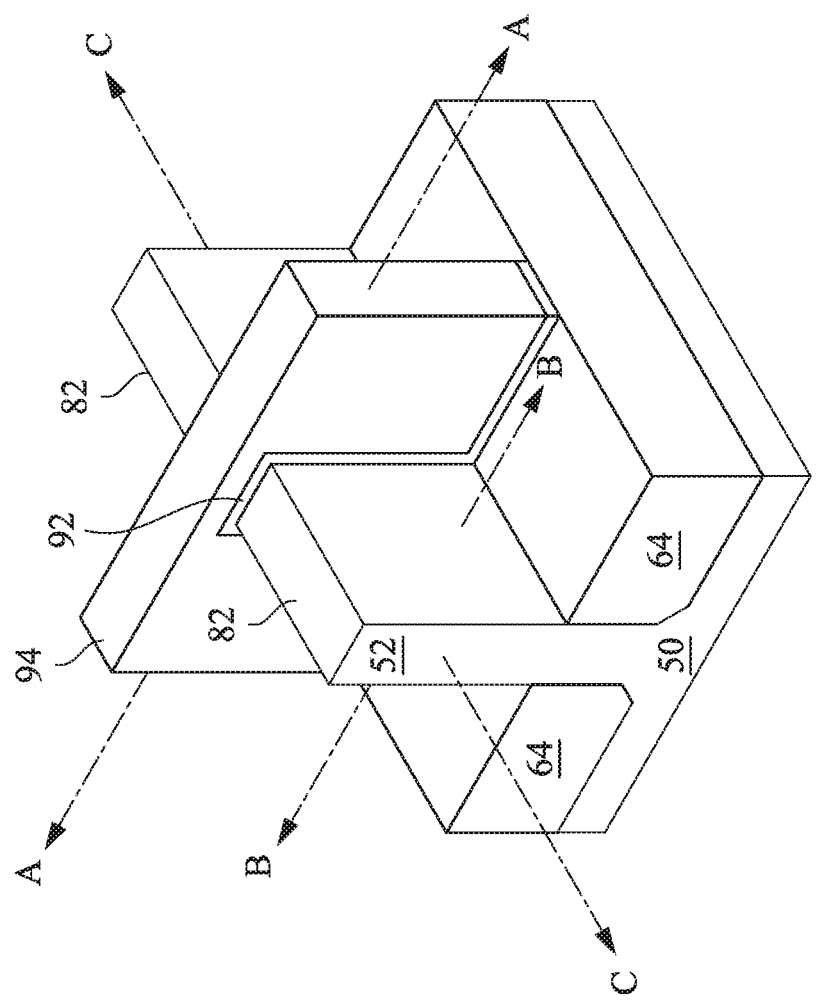
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide structures and processes for forming dummy fins on a semiconductor substrate having fin field effect transistors (finFET). During the fabrication process of embodiment finFET devices, dummy gate stacks may be initially formed over and along sidewalls of semiconductor fins. These dummy gate stacks are used as placeholders to define the position of subsequently formed functional gate stacks during various manufacturing processes (e.g., the formation of source/drain regions and the like). This process may also be referred to as a replacement gate process.

As a result of downsizing semiconductor features, fine-pitched dummy gate stacks may be formed in advanced technology nodes. During formation of fine-pitched dummy gate stacks, it may be desirable to maintain a uniform pattern of dummy gate stacks even in areas where no semiconductor fins are formed. For example, dummy gate stacks may be disposed directly on isolation regions disposed around the semiconductor fins in areas with uneven fin spacing and/or between boundaries of different finFET regions. However due to the fin-pitch and high aspect ratio of dummy gate stacks that are not formed over and along sidewalls of fins, these "unanchored" dummy gate stacks may be prone to collapse during the manufacturing process. For example, anchored dummy gate stacks are formed over and along sidewalls of semiconductor fins and are structurally supported by the semiconductor fins on which they are disposed. In contrast, unanchored dummy gate stacks are only formed over an insolation region (e.g., and not along sidewalls of the insolation region) and are less physically secure compared to anchored gate stacks. Various embodiments aim to reduce manufacturing defects by forming dummy fins (e.g., comprising one or more insulating layers) in order to anchor dummy gate stacks not formed on semiconductor fins. It has been observed that anchoring dummy gate stacks in this manner results in fewer manufacturing defects. Another benefit of dummy fins is the ability to use the dummy fins to reduce source/drain bridging during source/drain epitaxial growth processes as described in greater detail below.

FIG. 1 illustrates an example of a FinFET in a three-dimensional view, in accordance with some embodiments. The FinFET comprises a fin 52 on a substrate 50 (e.g., a semiconductor substrate). Isolation regions 64 are disposed in the substrate 50, and the fin 52 protrudes above and from between neighboring isolation regions 64. Although the isolation regions 64 are described/illustrated as being separate from the substrate 50, as used herein the term "substrate" may be used to refer to just the semiconductor substrate or a semiconductor substrate inclusive of isolation regions. A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and gate electrode 94. FIG. 1 further illustrates reference cross-sections that are used in later figures. Cross-section A-A is along a longitudinal axis of the gate electrode 94 and in a direction, for example perpendicular to the direction of current flow between the source/drain regions 82 of the FinFET. Cross-section B-B is parallel to cross-section A-A and extends through a source/drain region of the FinFET. Cross-section C-C is perpendicular to cross-section A-A and is along a longitudinal axis of the fin 52 and in a direction of, for example, a current flow between the source/drain regions 82 of the FinFET. Subsequent figures refer to these reference cross-sections for clarity.

FIGS. 2 through 17C are varying views of intermediate stages in the manufacturing of FinFETs, in accordance with some embodiments. FIGS. 2 through 8, 18 through 27, 29, and 30 illustrate reference cross-section A-A illustrated in FIG. 1, except for multiple fins/FinFETs. FIG. 9 illustrates a top-down view. In FIGS. 10A through 17C and 28A through 28C, figures ending with an "A" designation are illustrated along reference cross-section A-A illustrated in FIG. 1; figures ending with a "B" designation are illustrated along a similar cross-section B-B illustrated in FIG. 1; and figures ending with "C" designation are illustrated along a similar cross-section C-C illustrated in FIG. 1, except for multiple fins/FinFETs. Further, FIGS. 17D and 28D are illustrated along reference cross-section A-A illustrated in FIG. 1; FIGS. 17E, 14D, and 28E are illustrated along reference cross-section B-B in FIG. 1; and FIGS. 17F and 27F are illustrated along reference cross-section C-C in FIG. 1.

Figure 2:
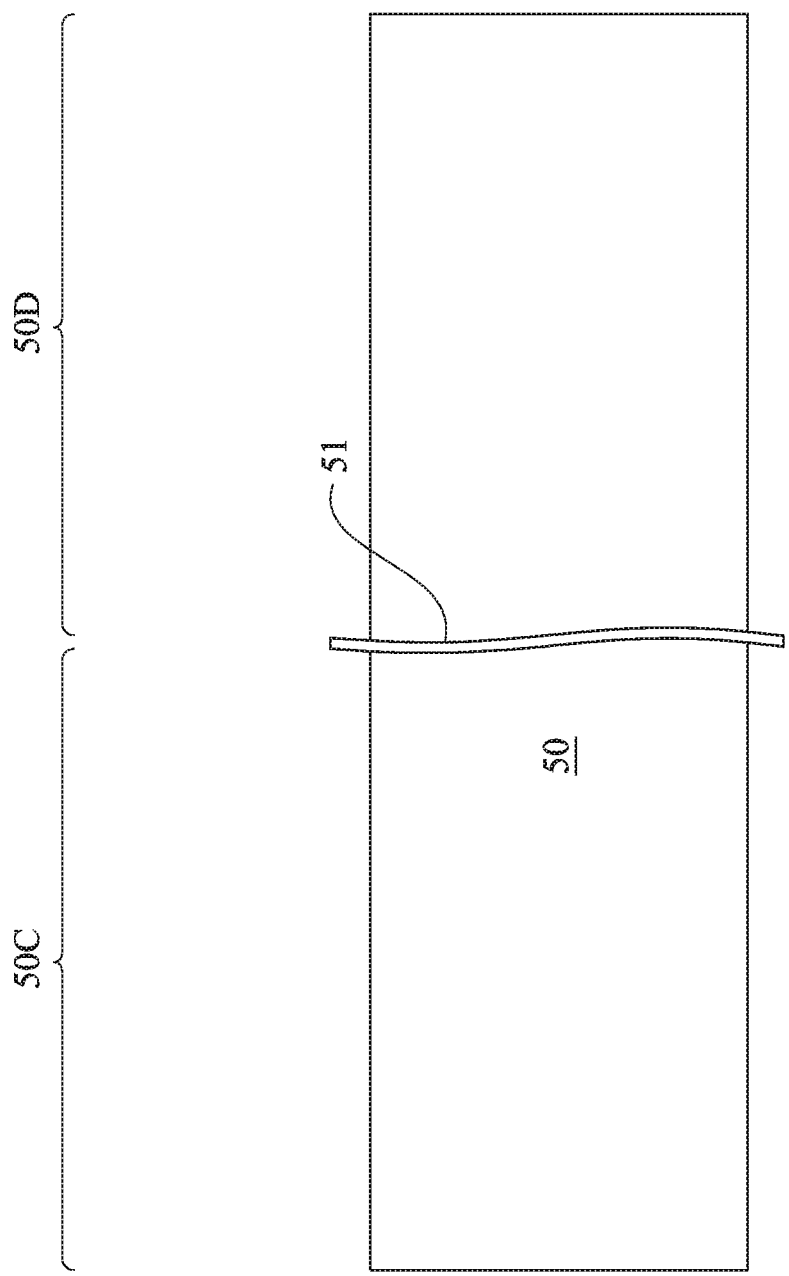

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a region 50C and a region 50D. The region 50C can be for forming n-type devices, such as NMOS transistors, e.g., n-type FinFETs. The region 50D can be for forming p-type devices, such as PMOS transistors, e.g., p-type FinFETs. The region 50C may be physically separated from the region 50D (as illustrated by divider 51), and any number of device features (e.g., other active devices, doped regions, isolation structures, etc.) may be disposed between the region 50C and the region 50D. In some embodiments, both the region 50C and the region 50D are used to form the same type of devices, such as both regions being for n-type devices or p-type devices. In subsequent description, only one region (e.g., either region 50C or 50D) is illustrated and any differences in forming different features in the other regions are described.

Figure 3:
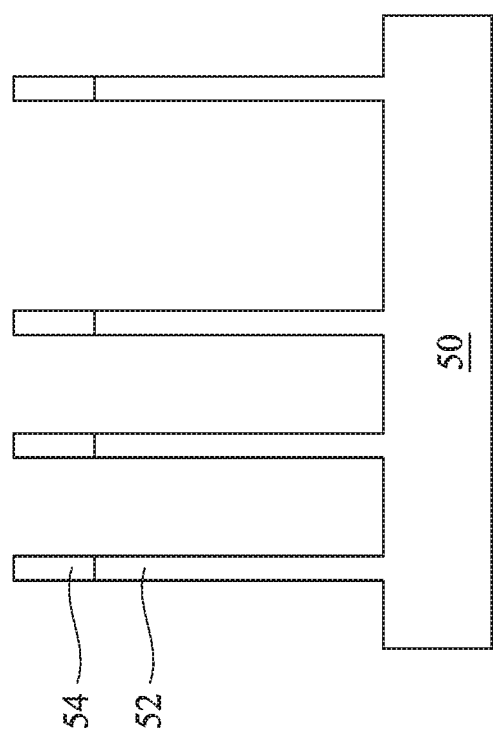

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic. In such embodiment, a mask layer 54 may be used to define a pattern of the fins 52. In some embodiments, the mask layer 54 may comprise silicon oxide, silicon nitride, silicon oxynitride, or the like. In some embodiments, the mask layer 54 comprises multiple sub-layers, such as a sub-layer of silicon nitride over a sub-layer of silicon oxide.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Figure 4:
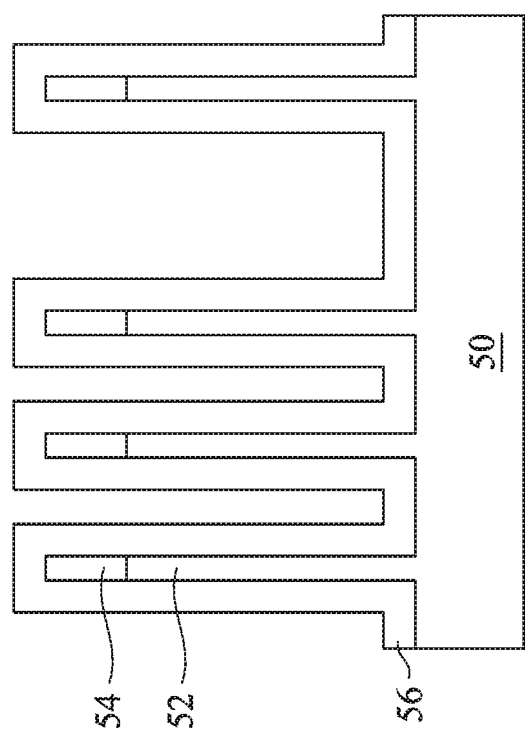

In FIG. 4, a dielectric liner 56 is deposited over and along sidewalls of the fins 52. The dielectric liner 56 may further extend along top surfaces of the fins 52 and top surfaces of the substrate 50 between the fins 52. The deposition of the dielectric liner 56 may be performed using a conformal deposition process, such as, chemical vapor deposition (CVD), atomic layer deposition (ALD), or the like. The dielectric liner 56 may comprise any suitable insulating material, such as, silicon oxide, or the like.

Figure 5:
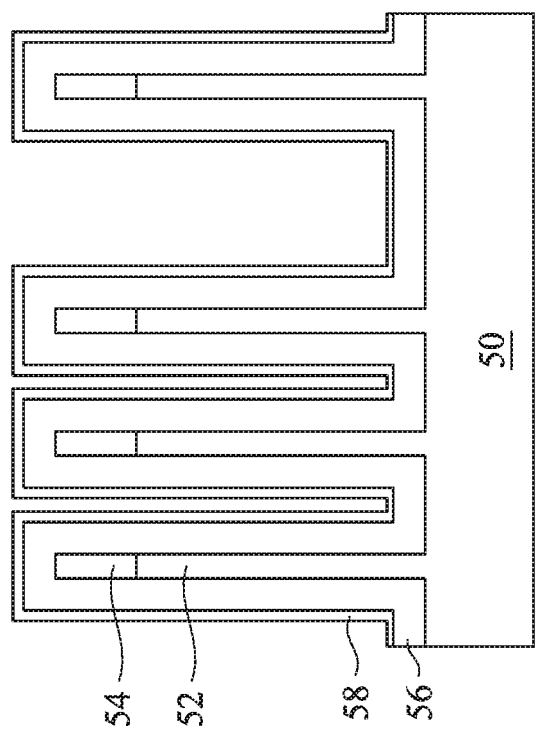

In FIG. 5, an optional dielectric liner 58 is deposited over the dielectric liner 56 such that the dielectric liner 58 is disposed along sidewalls and top surfaces of the fins 52. The dielectric liner 58 may further extend along top surfaces of the substrate 50 between the fins 52. The deposition of the dielectric liner 58 may be performed using a conformal deposition process, such as, CVD, ALD, or the like. The dielectric liner 58 may comprise a carbon-containing dielectric film (e.g., a carbon-containing oxide, such as, SiOC), a metal-containing dielectric film (e.g., a metal-containing oxide, such as, a combination of SiO and a metal), combinations thereof, or the like. In other embodiments, the dielectric liner 58 may be omitted (see e.g., FIGS. 17C-17E).

Figure 6:
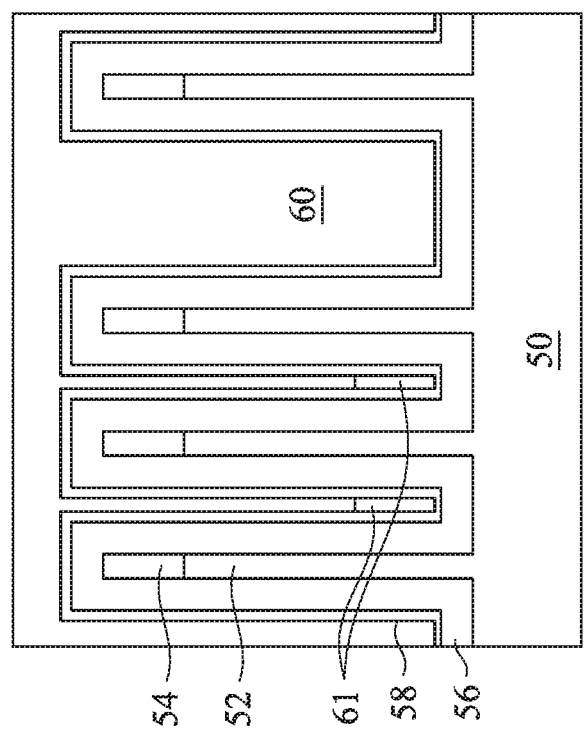

In FIG. 6, a dielectric material 60 is deposited over the dielectric films 56 and 58. The dielectric material 60 may be deposited between the fins 52 to fill or overfill areas between the fins 52. In some embodiments, the dielectric material 60 may be deposited using a flowable deposition process, a spin-on process, or the like. In some embodiments, the deposition of the dielectric material 60 may define voids 61 between adjacent ones of the fins 52 and between the dielectric material 60 and the dielectric films 56/58. The voids 61 may be formed, for example, due to a high aspect ratio between adjacent ones of the fins 52. A height of voids 61 may be less than a final height of subsequently formed dummy fins (e.g., tops of voids 61 may be lower than tops of dummy fins 62, see FIG. 8). It has been observed that by observing this height relationship, device performance is not negatively affected by the presence of the voids 61. In other embodiments, the voids 61 are not formed. The dielectric material 60 may comprise a carbon-containing dielectric film (e.g., a carbon-containing oxide, such as, SiOC), a metal-containing dielectric film (e.g., a metal-containing oxide, such as, a combination of SiO and a metal), or the like. In some embodiments, a carbon and/or metal percentage by weight of the dielectric material 60 is less than a corresponding carbon/metal percentage by weight of the dielectric liner 58 (if present). For example, the dielectric liner 58 may comprise SiOC with more than 10% by weight of carbon, and the dielectric material 60 may comprise SiOC with less than 10% by weight of carbon.

Figure 7A:
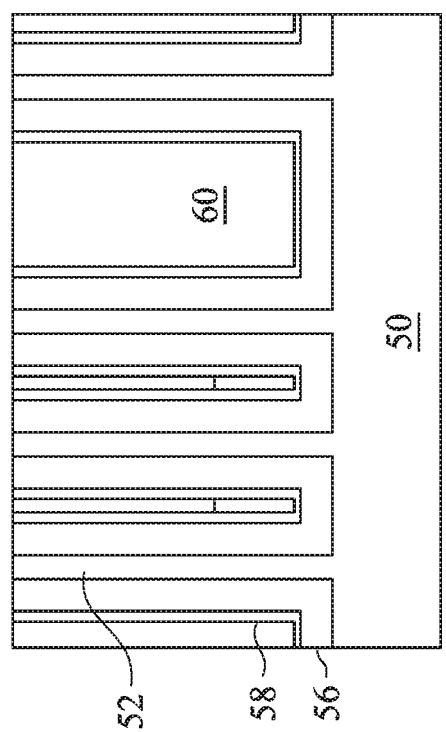
Figure 7B:
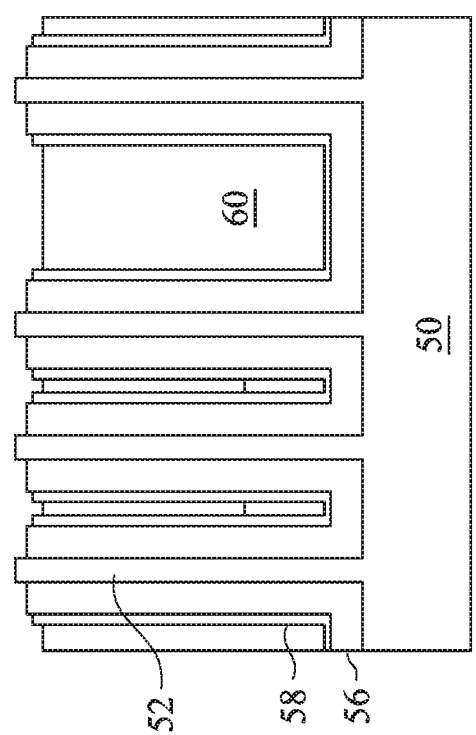

In FIG. 7A, a planarization (e.g., a chemical mechanical polish (CMP)) and/or etch back process (e.g., a dry etching process) is used to expose upper surfaces of the fins 52. In particular, upper portions of the dielectric material 60, the dielectric liner 58 (if present), the dielectric liner 56, and the mask layer 54 are removed so that fins 52 are exposed. In some embodiments, exposing the fins 52 results in upper surfaces of the dielectric material 60, the dielectric liner 58, the dielectric liner 56, and the fins 52 being substantially coplanar. In other embodiments, exposing the fins 52 results in upper surfaces of the dielectric material 60, the dielectric liner 58, the dielectric liner 56, and the fins 52 being non-coplanar (see e.g., FIG. 7B). Variances in height may be due to the different material compositions of the fins 52, the dielectric liner 56, the dielectric liner 58 (if present), and the dielectric material 60 being polished/etched at different rates during an applicable planarization process. Although subsequent figures illustrate these upper surfaces as being coplanar for ease of illustration, it is understood that embodiments with non-coplanar upper surfaces, such as illustrated by FIG. 7B, are also contemplated in subsequent processing steps and/or subsequently described embodiments.

Figure 8:
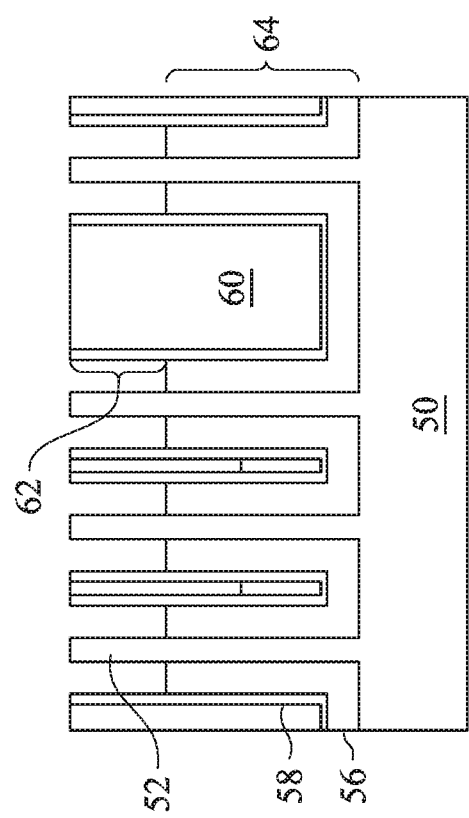
Figure 9:
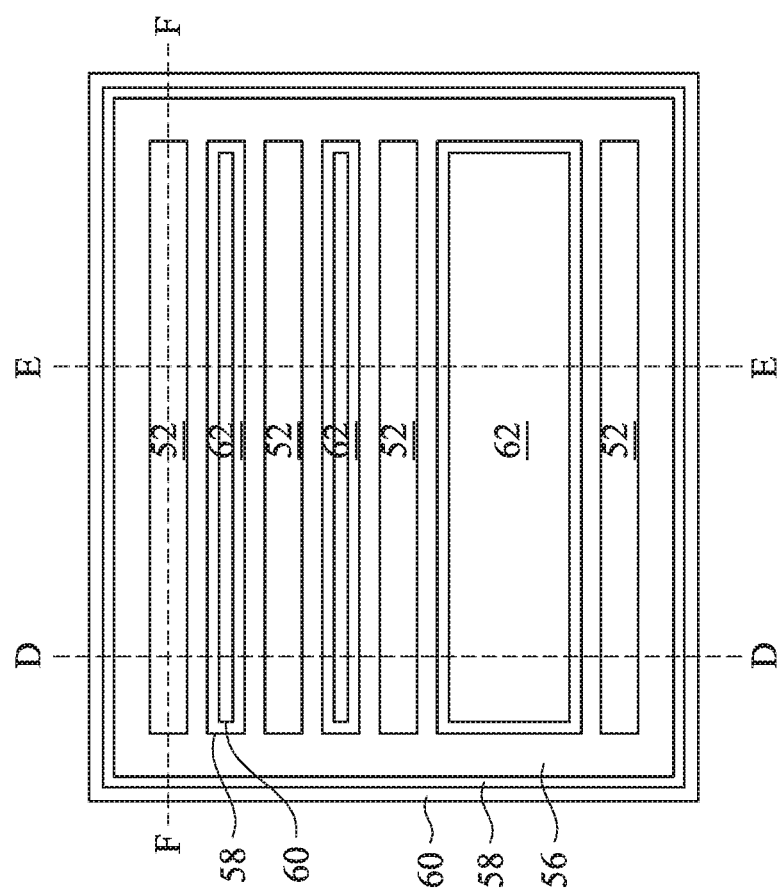

In FIG. 8, an additional etch back process is performed on the dielectric liner 56. The dielectric liner 56 is recessed such that portions of semiconductor fins 52 and dummy fins 62 protrude above top surfaces of the dielectric liner 56. In some embodiments, after recessing, a height of the semiconductor fins 52 may be substantially the same as a height of the dummy fins 62. Dummy fins 62 are made of upper portions of the dielectric liner 58 (if present) and upper portions of the dielectric material 60, which extend above a top surface of the dielectric liner 56. Thus, the dummy fins 62 may have a different material composition than semiconductor fins 52, and the dummy fins 62 may be insulating fins. Further, remaining portions of the dielectric liner 56, lower portions of the dielectric liner 58, and lower portions of the dielectric material 60 (referred to collectively as isolation region 64) provide electrical isolation between adjacent fins 52 and may further provide shallow trench isolation (STI) regions between the fins 52 such that a separate STI region need not be formed.

Figure 29:
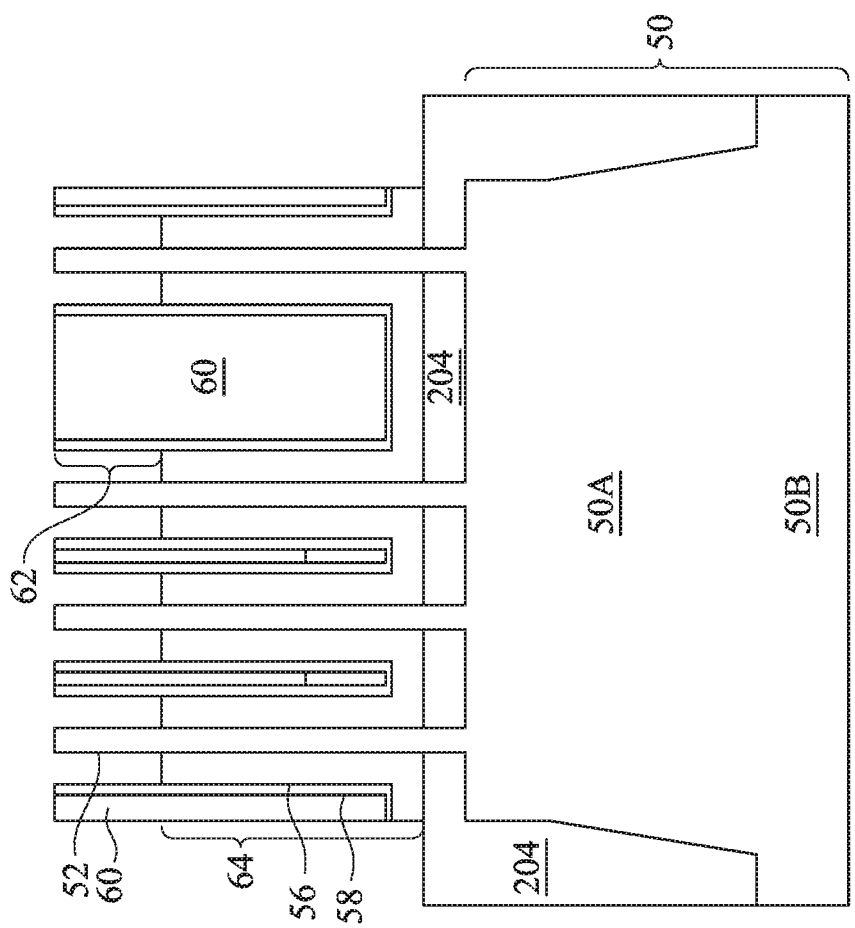
FIGS. 29, 30A, 30B, and 30C illustrate cross-sectional views of intermediary stages of manufacturing a device in accordance with some alternative embodiments.
Figure 30B:
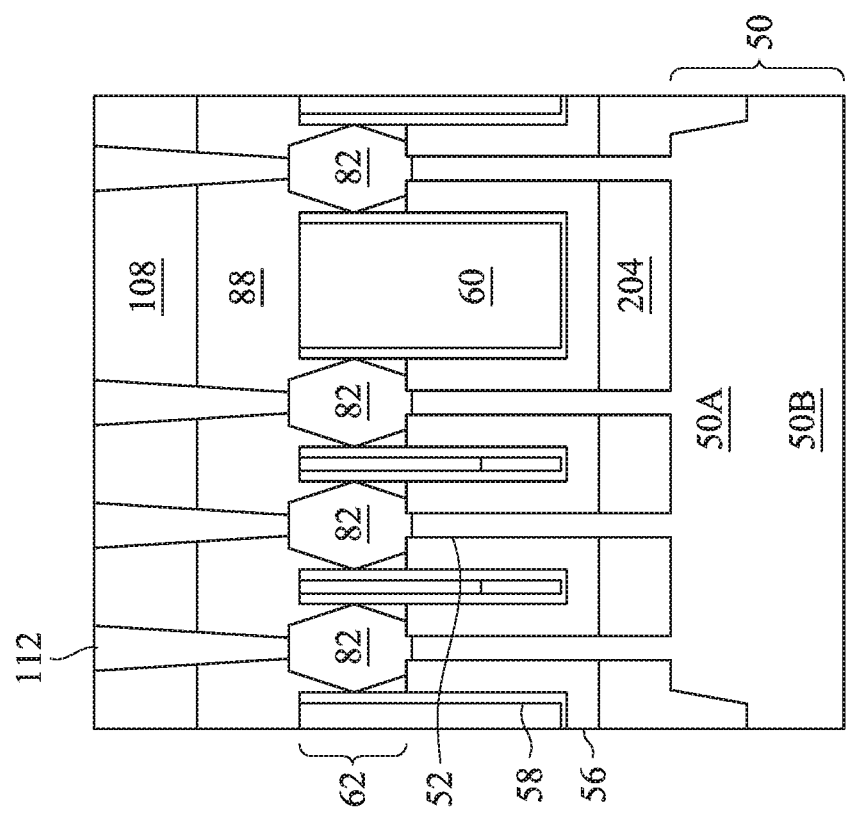
Figure 30A:
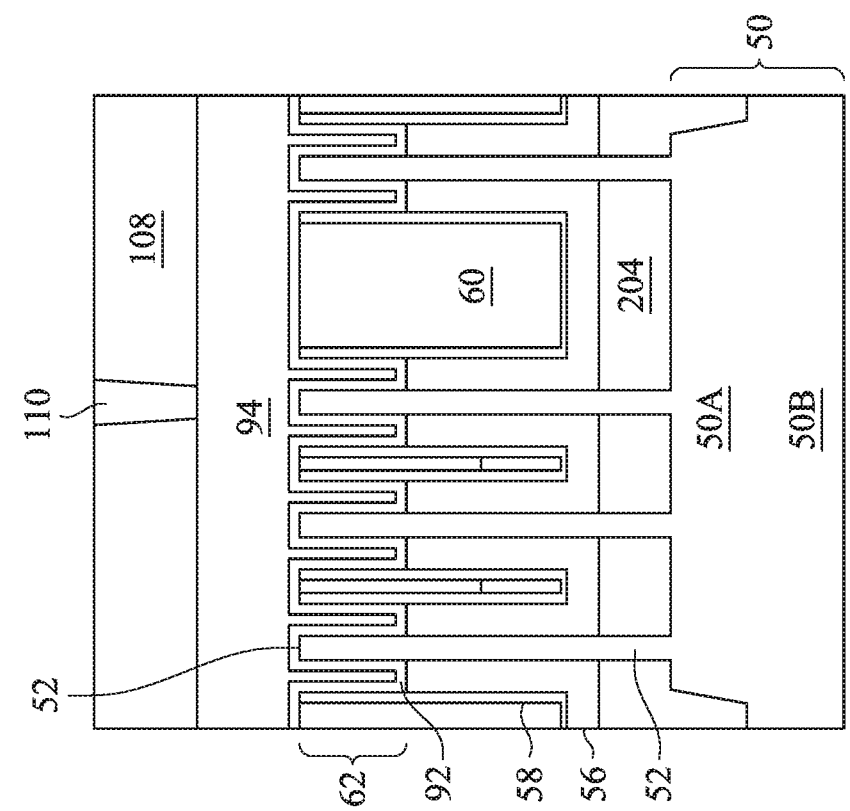
Figure 30C:
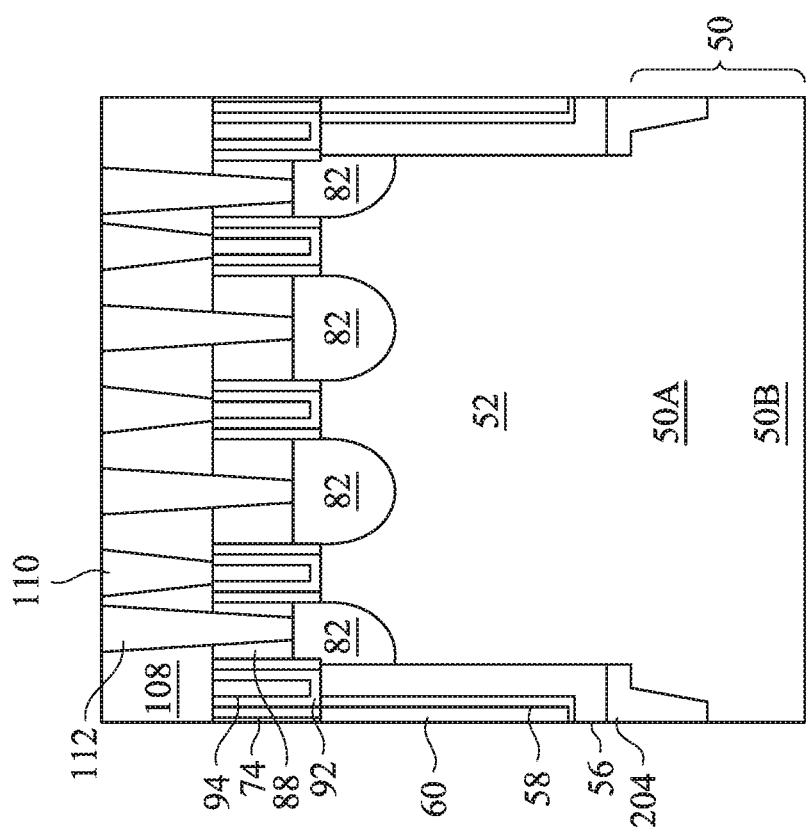

In other embodiments, a separate STI region is formed (e.g., between a bottom surface of the dielectric film 56 and the substrate 50). For example, FIG. 29 illustrates an embodiment where a separate STI region 204 is formed between bottom surfaces of the dielectric film 56 and top surfaces of the substrate 50 (labeled as 50A). STI region 204 may comprise a suitable insulating material, such as, silicon oxide, silicon nitride, silicon oxynitride, combinations thereof, or the like. In the embodiment of FIG. 29, individual fins 52 may be connected by a mesa 50A (sometimes referred to as a crown). Mesa 50A is a portion of the substrate 50. Multiple fins 52 may extend from a single mesa 50A, which is connected to a lower portion of the substrate 50 (labeled as 50B). Mesa 50A may provide improved structural stability in the formation of high aspect ratio fins (e.g., fins 52). STI region 204 may be formed to extend along lower portions of the fins 52 as well as along sidewalls of the mesa 50A. Mesa 50A may be patterned and STI region 204 may be formed prior to the deposition of the dielectric film 56 in various embodiments. Although subsequent figures illustrate embodiments where the mesa 50A and STI region 204 are excluded, this is for ease of illustration only. It should be recognized that the embodiment of FIG. 29 may be incorporated into subsequent process steps and combined with subsequent descriptions. For example, FIGS. 30A, 30B, and 30C illustrate a finFET device after further processing, e.g., using similar processes as described below in FIGS. 10A through 17C where like reference numerals indicate like elements formed using like processes, incorporating a separate STI region as described with respect to FIG. 29. FIG. 30A is taken along reference cross-section A-A of FIG. 1; FIG. 30B is taken along reference cross-section B-B of FIG. 1; and FIG. 30C is taken along reference cross-section C-C of FIG. 1.

Referring back to FIG. 8, patterning dielectric liner 56 may use a selective etching process which selectively etches the dielectric liner 56 at a faster rate than the dielectric liner 58, the dielectric material 60, and the fins 52. For example, the etching process may use fluorine and nitrogen containing chemistries, or the like, and the etching may be performed at a temperature of about 30° C. to about 120° C. Such selective etching may be enabled, for example, by the inclusion of carbon and/or a metal in the dielectric liner 58 and the dielectric material 60.

In some embodiments, it may be advantageous to epitaxially grow a material in an NMOS region different from the material in a PMOS region. In various embodiments, the fins 52 may be formed from silicon germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Further in FIG. 8, appropriate wells (not shown) may be formed in the fins the fins 52 and/or the substrate 50. In some embodiments, a P well may be formed in the region 50C, and an N well may be formed in the region 50D. In some embodiments, a P well or an N well are formed in both the region 50C and the region 50D.

In the embodiments with different well types, the different implant steps for the region 50C and the region 50D (see FIG. 2) may be achieved using a photoresist or other masks (not shown). For example, a photoresist may be formed over the fins 52 and the dummy fins 62 in the region 50C. The photoresist is patterned to expose the region 50D of the substrate 50, such as a PMOS region. The photoresist can be formed by using a spin-on technique and can be patterned using acceptable photolithography techniques. Once the photoresist is patterned, an n-type impurity implant is performed in the region 50D, and the photoresist may act as a mask to substantially prevent n-type impurities from being implanted into the region 50C, such as an NMOS region.

The n-type impurities may be phosphorus, arsenic, or the like implanted in the region to a concentration of equal to or less than $10^{18}$ cm$^{-3}$, such as between about $10^{17}$ cm$^{-3}$ and about $10^{18}$ cm$^{-3}$. After the implant, the photoresist is removed, such as by an acceptable ashing process.

Following the implanting of the region 50D, a photoresist is formed over the fins 52 and the dummy fins 62 in the region 50D. The photoresist is patterned to expose the region 50C of the substrate 50, such as the NMOS region. The photoresist can be formed by using a spin-on technique and can be patterned using acceptable photolithography techniques. Once the photoresist is patterned, a p-type impurity implant may be performed in the region 50C, and the photoresist may act as a mask to substantially prevent p-type impurities from being implanted into the region 50D, such as the PMOS region. The p-type impurities may be boron, BF$_2$, or the like implanted in the region to a concentration of equal to or less than $10^{18}$ cm$^{-3}$, such as between about $10^{17}$ cm$^{-3}$ and about $10^{18}$ cm$^{-3}$. After the implant, the photoresist may be removed, such as by an acceptable ashing process.

After the implants of the region 50C and the region 50D, an anneal may be performed to activate the p-type and/or n-type impurities that were implanted. In some embodiments, the grown materials of epitaxial fins may be in situ doped during growth, which may obviate the implantations, although in situ and implantation doping may be used together.

FIG. 9 illustrates a top-down view of the fins 52 and the dummy fins 62. As illustrated, the fins 52 are surrounded by insulating materials (e.g., a combination of the dielectric film 56, the dielectric film 58, and the dielectric material 60). Further, in the dummy fins 62, the dielectric material 60 may be surrounded by the dielectric film 58. FIG. 9 illustrates various cross-sections, which are referenced in subsequent figures. Cross-section D-D corresponds to cross-section A-A of FIG. 1; cross-section E-E corresponds to cross-section B-B of FIG. 1, and cross-section F-F corresponds to cross-section C-C of FIG. 1.

Figure 10B:
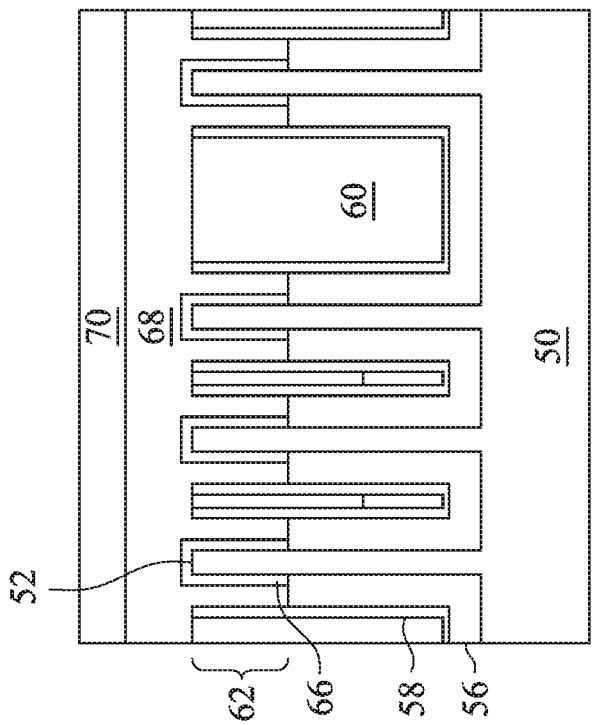
Figure 10A:
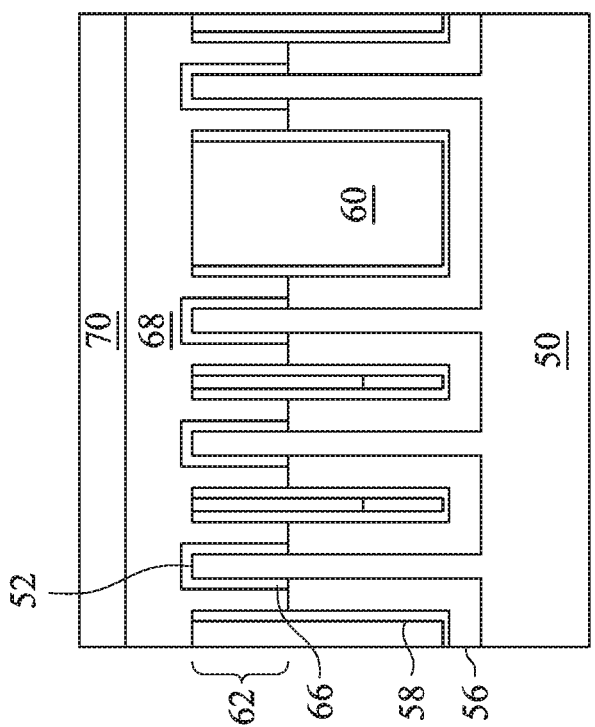
Figure 10C:
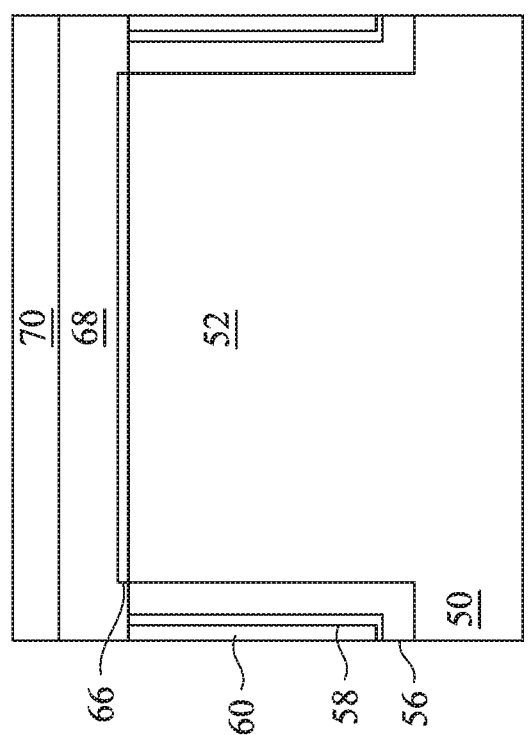

In FIGS. 10A, 10B, and 10C, a dummy dielectric layer 66 is formed on the fins 52 and the dummy fins 62. FIG. 10A illustrates a cross-sectional view taken along line D-D of FIG. 9 and line A-A of FIG. 1; FIG. 10B illustrates a cross-sectional view taken along line E-E of FIG. 9 and line B-B of FIG. 1; and FIG. 10C illustrates a cross-sectional view taken along line F-F of FIG. 9 and line C-C of FIG. 1. The dummy dielectric layer 66 may be, for example, silicon oxide, silicon nitride, a combination thereof, or the like, and may be deposited or thermally grown according to acceptable techniques. For example, FIGS. 10A through 10C illustrate the dummy dielectric layer 66 formed using an embodiment thermal oxidation process where the dummy dielectric layer 66 is be selectively grown on the semiconductor fins 52 without being grown on the dummy fins 62. In other embodiments (e.g., where dummy dielectric layer 66 is deposited), the dummy dielectric layer 66 is formed on the semiconductor fins 52 as well as the dummy fins 62. A dummy gate layer 68 is formed over the dummy dielectric layer 66, and a mask layer 70 is formed over the dummy gate layer 68. The dummy gate layer 68 may be deposited over the dummy dielectric layer 68 and then planarized, such as by a CMP. The mask layer 70 may be deposited over the dummy gate layer 68. The dummy gate layer 68 may be a conductive material and may be selected from a group including polycrystalline-silicon (polysilicon), polycrystalline silicon-germanium (poly-SiGe), metallic nitrides, metallic silicides, metallic oxides, and metals. In one embodiment, amorphous silicon is deposited and recrystallized to create polysilicon. The dummy gate layer 68 may be deposited by physical vapor deposition (PVD), CVD, sputter deposition, or other techniques known and used in the art for depositing conductive materials. The dummy gate layer 68 may be made of other materials that have a high etching selectivity from the etching of isolation regions. The mask layer 70 may include, for example, SiN, SiON, or the like. In this example, a single dummy gate layer 68 and a single mask layer 70 are formed across the region 50C and the region 50D (see FIG. 2). In some embodiments, separate dummy gate layers may be formed in the region 50C and the region 50D, and separate mask layers may be formed in the region 50C and the region 50D.

FIGS. 11A through 17C illustrate various additional steps in the manufacturing of embodiment devices. FIGS. 11A through 16C illustrate features in either of the region 50C and the region 50D. For example, the structures illustrated in FIGS. 11A through 16C may be applicable to both the region 50C and the region 50D. Differences (if any) in the structures of the region 50C and the region 50D are described in the text accompanying each figure.

Figure 11D:
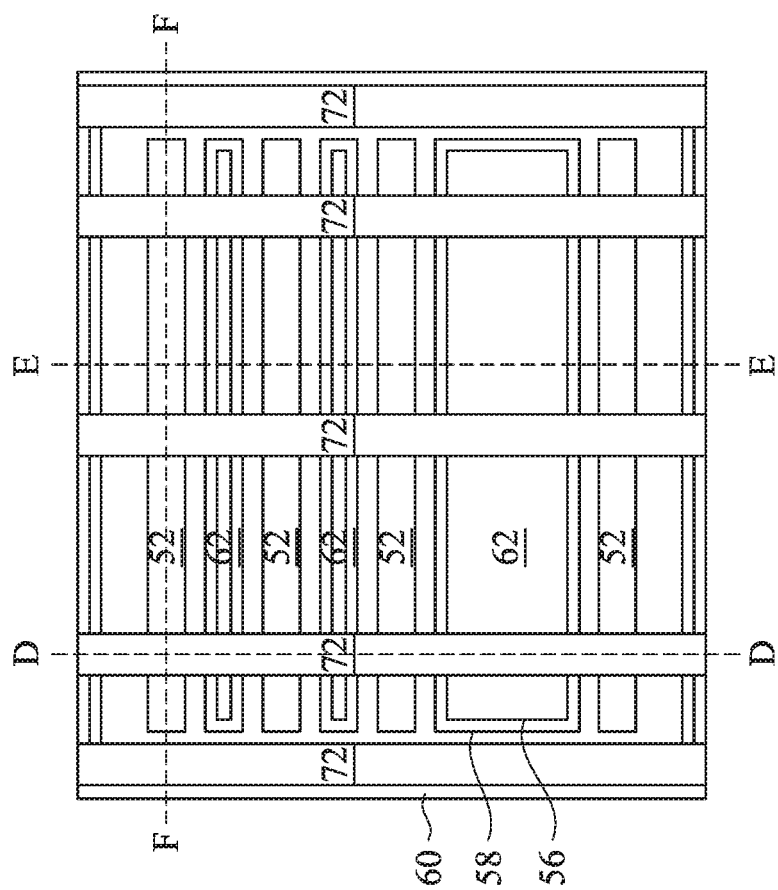
Figure 11C:
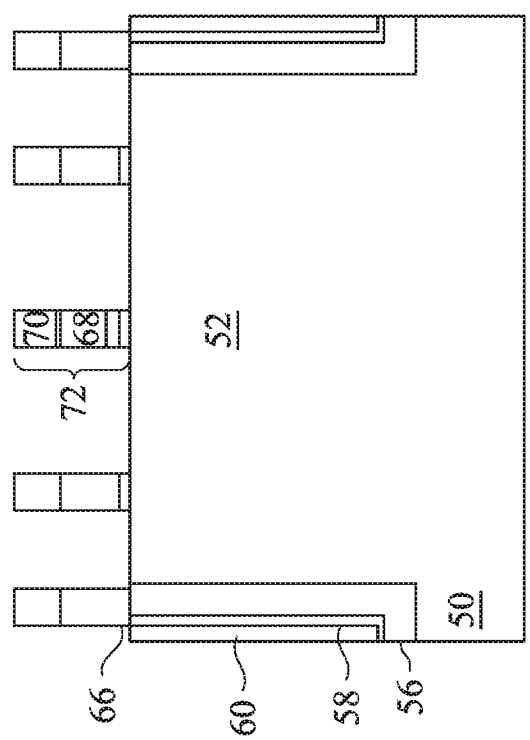

In FIGS. 11A, 11B, 11C, and 11D, the mask layer 70 may be patterned using acceptable photolithography and etching techniques to form masks 70. FIG. 11D illustrates a top down view of the semiconductor device. FIG. 11 illustrates various cross-sections, which are referenced in subsequent figures. Cross-section D-D corresponds to cross-section A-A of FIG. 1; cross-section E-E corresponds to cross-section B-B of FIG. 1, and cross-section F-F corresponds to cross-section C-C of FIG. 1. FIG. 11A illustrates a cross-sectional view taken along line A-A of FIG. 1 and line D-D of FIG. 11D; FIG. 11B illustrates a cross-sectional view taken along line B-B of FIG. 1 and line E-E of FIG. 11D; and FIG. 11C illustrates a cross-sectional view taken along line C-C of FIG. 1 and line F-F of FIG. 11D.

The pattern of the masks 70 then may be transferred to the dummy gate layer 78 and the dummy dielectric layer 66 by an acceptable etching technique to form dummy gates 72. The dummy gates 72 cover respective channel regions of the fins 52. The pattern of the masks 70 may be used to physically separate each of the dummy gates 72 from adjacent dummy gates. The dummy gates 72 may also have a lengthwise direction substantially perpendicular to the lengthwise direction of respective epitaxial fins 52 and the dummy fins 62. Further the dummy fins 62 may provide additional structural support for the dummy gates 72 formed over and along sidewalls of the dummy fins 62. For example, absent the dummy fins 62, the dummy gates 72 not disposed over the fins 52 may be formed with planar bottom surfaces. In such embodiments (e.g., absent the dummy fins 62), the dummy gates 72 with planar bottom surfaces has less structural support and may collapse especially when the dummy gates 72 have high aspect ratios (e.g., with heights in a range of about 130 nm to about 160 nm and widths in the range of about 10 nm to about 20 nm), resulting in manufacturing defects, Thus, the inclusion of the dummy fins 62 in various embodiments may advantageously improve the structural support for the dummy gates 72 and reduce manufacturing defects.

Further, gate seal spacers (not explicitly illustrated) can be formed on exposed surfaces of the dummy gates 72, the masks 70, and/or the fins 52. A thermal oxidation or a deposition followed by an anisotropic etch may form the gate seal spacers.

After the formation of the gate seal spacers, implants for lightly doped source/drain (LDD) regions (not explicitly illustrated) may be performed. In the embodiments with different device types, similar to the implants discussed above in FIG. 8, a mask, such as a photoresist, may be formed over the region 50C, while exposing the region 50D, and appropriate type (e.g., n-type or p-type) impurities may be implanted into the exposed fins 58 in the region 50D. The mask may then be removed. Subsequently, a mask, such as a photoresist, may be formed over the region 50D while exposing the region 50C, and appropriate type impurities may be implanted into the exposed fins 52 in the region 50C. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{16}$ cm$^{-3}$. An anneal may be used to activate the implanted impurities.

Figure 12B:
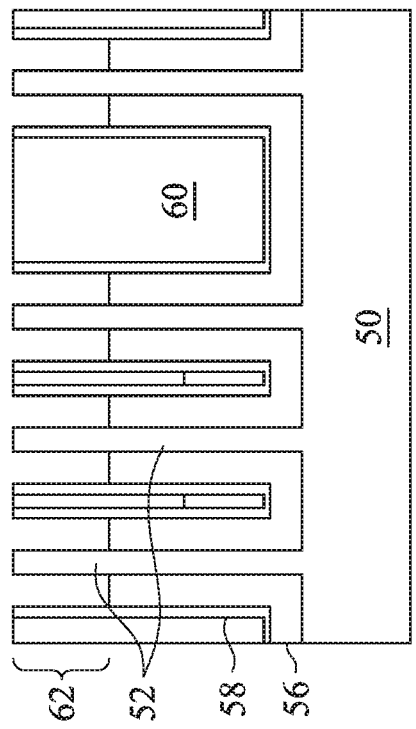
Figure 12A:
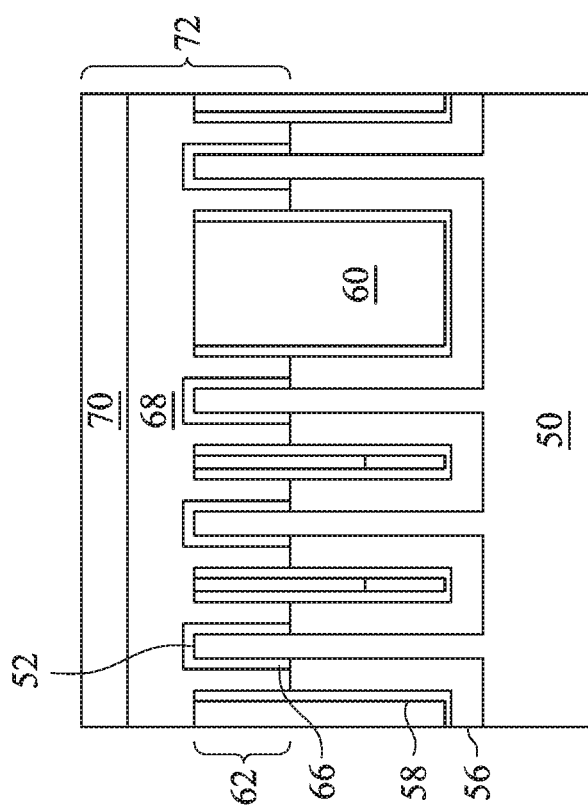
Figure 12C:
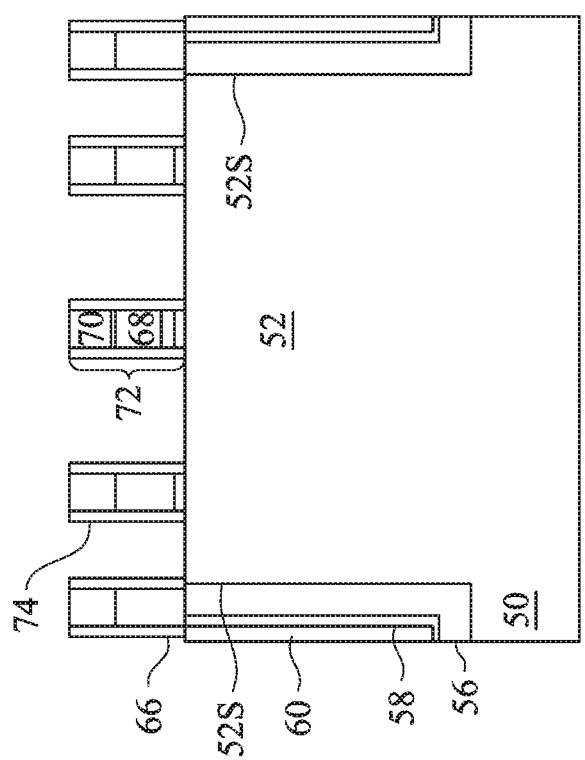

In FIGS. 12A, 12B, and 12C, gate spacers 74 are formed on the gate seal spacers (not explicitly illustrated) along sidewalls of the dummy gates 72. The gate spacers 74 may be formed by conformally depositing a material and subsequently anisotropically etching the material. The material of the gate spacers 74 may be silicon nitride, SiCN, a combination thereof, or the like.

In FIGS. 13A, 13B, 13C, 14A, 14B, and 14C epitaxial source/drain regions 82 are formed in the fins 52. The epitaxial source/drain regions 82 are formed in the fins 58 such that each dummy gate 72 is disposed between respective neighboring pairs of the epitaxial source/drain regions 82. In some embodiments that epitaxial source/drain regions 82 may extend into the fins 52. In some embodiments, the gate spacers 74 are used to separate the epitaxial source/drain regions 82 from the dummy gates 72 by an appropriate lateral distance so that the epitaxial source/drain regions 82 do not short out subsequently formed gates of the resulting FinFETs.

Figure 13C:
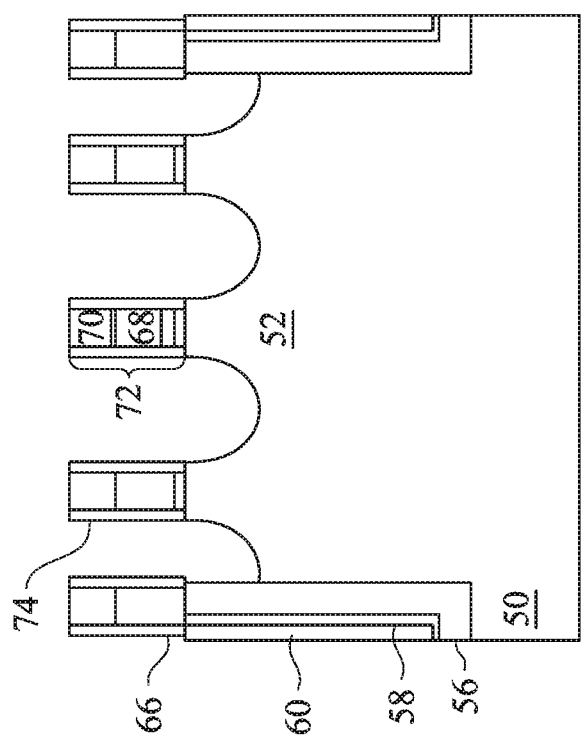

Referring first to FIGS. 13A, 13B, and 13C, portions of the semiconductor fins 52 are etched, such as portions of the fins 52 not masked by the dummy gates 72 in cross-sections B-B and C-C of FIG. 1 (see FIGS. 13B and 13C). Etching the semiconductor fins 52 may recess the semiconductor fins 52 below a top surface of dielectric film 56. Recessing the fins 52 may use a selective etch process which etches the fins 52 without significantly etching the dummy gates 72 or the dummy fins 62. In various embodiments, the fins 52 may be recessed separately in the regions 50B and 50C, for example, while the other region is masked.

Figure 14B:
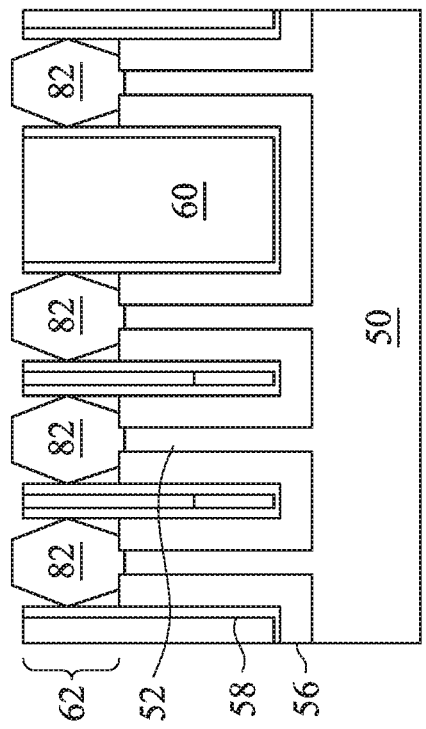
Figure 14A:
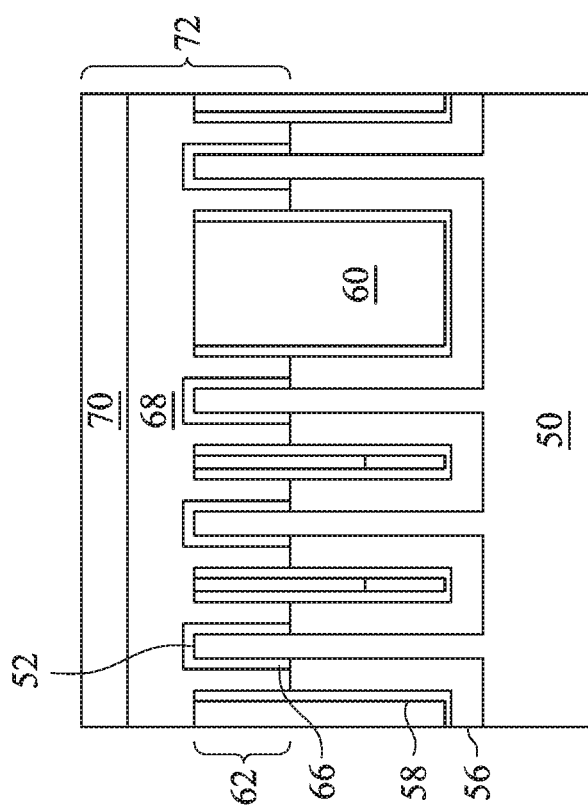
Figure 14C:
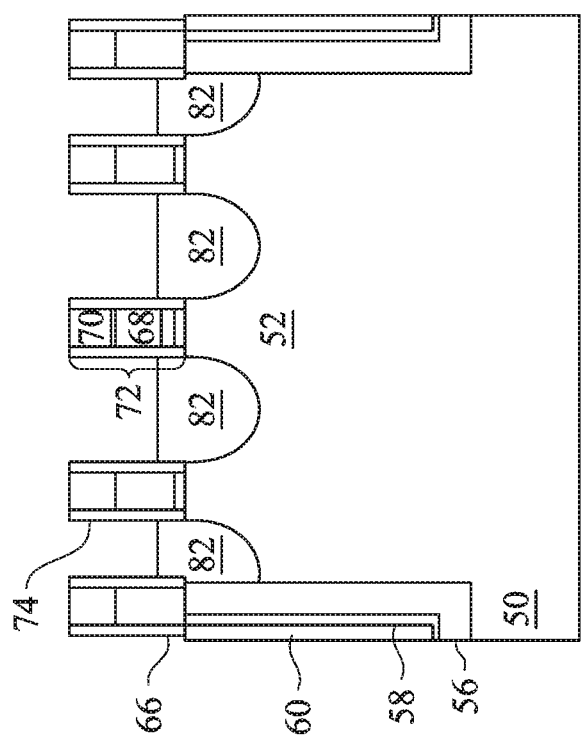
Figure 14D:
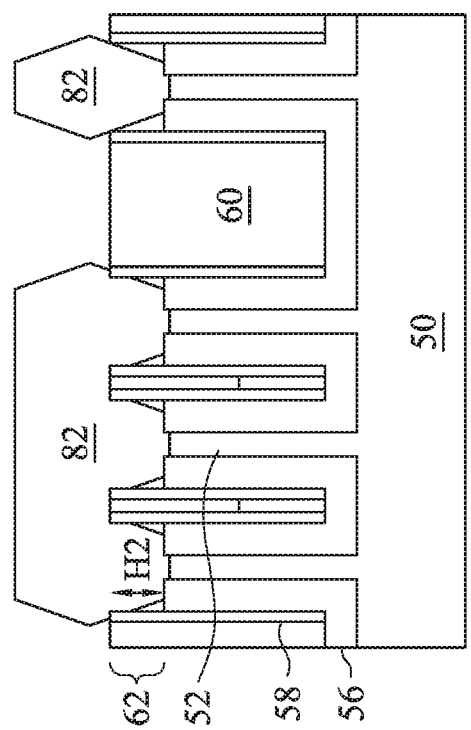

In FIGS. 14A, 14B, and 14C, the epitaxial source/drain regions 82 in the region 50C, e.g., the NMOS region, may be formed by masking the region 50D, e.g., the PMOS region, and etching source/drain regions of the fins 58 in the region 50C form recesses in the fins 58. Then, the epitaxial source/drain regions 82 in the region 50C are epitaxially grown in the recesses. The epitaxial source/drain regions 82 may include any acceptable material, such as appropriate for n-type FinFETs. For example, if the fin 58 is silicon, the epitaxial source/drain regions 82 in the region 50C may include silicon, SiC, SiCP, SiP, or the like. The epitaxial source/drain regions 82 in the region 50C may have surfaces raised from respective surfaces of the fins 58 and may have facets. In some embodiments, the dummy fins 62 provide physical separation between adjacent ones of the epitaxial source/drain regions 82 in the region 50C and prevent merging of adjacent epitaxial source/drain regions 82 in the region 50C during epitaxy.

The epitaxial source/drain regions 82 in the region 50D, e.g., the PMOS region, may be formed by masking the region 50C, e.g., the NMOS region, and etching source/drain regions of the fins 58 in the region 50D to form recesses in the fins 58. Then, the epitaxial source/drain regions 82 in the region 50D are epitaxially grown in the recesses. The epitaxial source/drain regions 82 may include any acceptable material, such as appropriate for p-type FinFETs. For example, if the fin 58 is silicon, the epitaxial source/drain regions 82 in the region 50D may comprise SiGe, SiGeB, Ge, GeSn, or the like. The epitaxial source/drain regions 82 in the region 50D may also have surfaces raised from respective surfaces of the fins 58 and may have facets. In some embodiments, the dummy fins 62 provide physical separation between adjacent ones of the epitaxial source/drain regions 82 in the region 50D and prevents merging of adjacent epitaxial source/drain regions 82 in the region 50D during epitaxy.

The epitaxial source/drain regions 82 and/or the fins 52 may be implanted with dopants to form source/drain regions, similar to the process previously discussed for forming lightly doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

As a result of the epitaxy processes used to form the epitaxial source/drain regions 82 in the region 50C and the region 50D, upper surfaces of the epitaxial source/drain regions 82 have facets which expand laterally outward beyond a sidewalls of the fins 52. As illustrated in FIG. 14B, the upper surfaces of the epitaxial source/drain regions 82 may contact sidewalls of the dummy fins 62, and the dummy fins 62 may prevent adjacent epitaxial source/drain regions 82 from merging. This may be particularly beneficial in fine-pitched areas (e.g., memory areas) of a chip where different devices are closely spaced together, and the dummy fins 62 may be used to prevent merging of epitaxial source/drain regions 82 of different devices (e.g., an n-type device and a p-type device) that are adjacent to each other. Alternatively as illustrated by FIG. 14D, the dummy fins 62 may be etched back prior to forming the epitaxial source/drain regions 82. For example, a height H2 of the dummy fins 52 in FIG. 14D may be less than a height H1 of the dummy fins 52 in FIGS. 13B and 14B. As a result of the etching, the dummy fins 62 do not prevent the merging of adjacent epitaxial source/drain regions. Thus, in FIG. 14D, some epitaxial source/drain regions 82 extend over the dummy fins 52 and have a merged profile. Merged epitaxial source/drain regions may be beneficial for enlarging a current transport area of the device, which lowers resistance. In some embodiments, the different profiles of epitaxial source/drain regions 82 and dummy fins 62 in FIGS. 14B and 14D may be combined in a single die. For example, epitaxial source/drain regions 82 and dummy fins 62 having a configuration (e.g., unmerged source/drain regions) illustrated by FIG. 14B may be found in a first area of a die, and epitaxial source/drain regions 82 and dummy fins 62 having a configuration (e.g., merged source/drain regions) illustrated by FIG. 14D may be found in a second area of a die. In a specific example, the first area of the die is a memory area, and the second area of the die is a logic area. Subsequent embodiments only illustrate unmerged epitaxial source/drain regions 82; however, the merged epitaxial source/drain regions 82 described in conjunction with FIG. 14D may also be applied to the subsequent embodiments either in lieu of or in combination with the unmerged epitaxial source/drain regions.

Figure 15A:
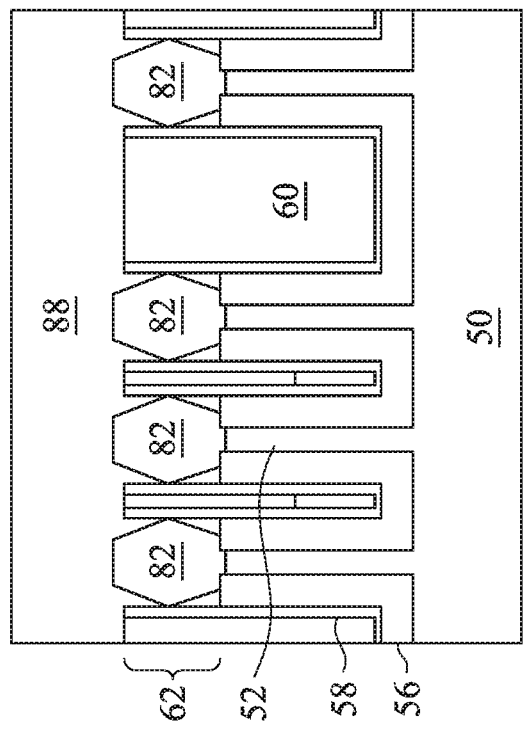
Figure 15B:
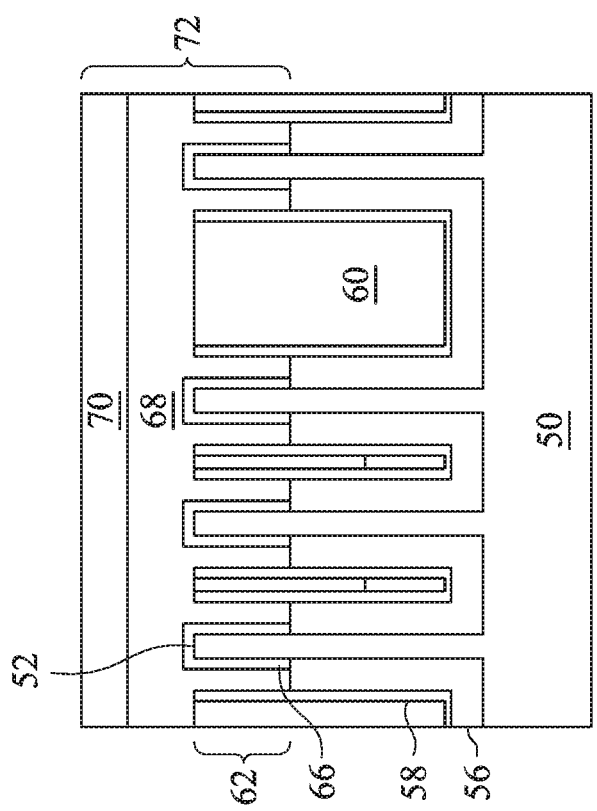
Figure 15C:
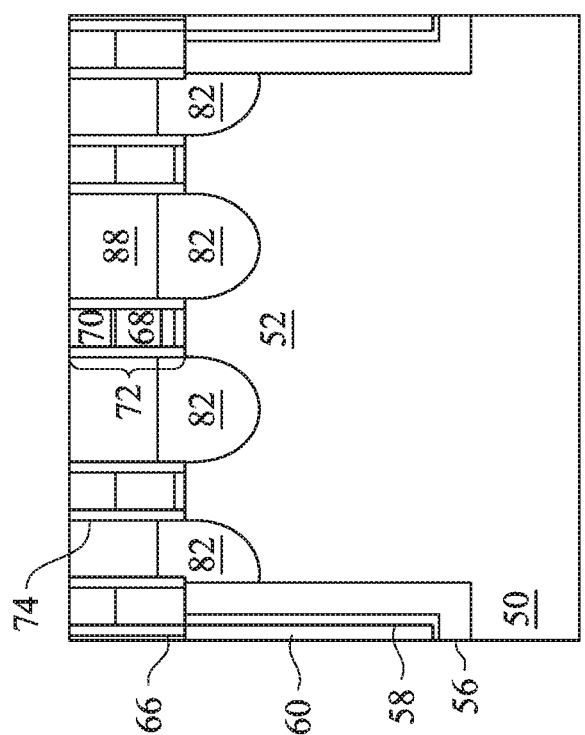

In FIGS. 15A, 15B, and 15C, an ILD 88 is deposited over the structure illustrated in FIGS. 14A, 14B, ad 14C. The ILD 88 may be formed of a dielectric material, and may be deposited by any suitable method, such as CVD, plasma-enhanced CVD (PECVD), or FCVD. Dielectric materials may include Phospho-Silicate Glass (PSG), Boro-Silicate Glass (BSG), Boron-Doped Phospho-Silicate Glass (BPSG), undoped Silicate Glass (USG), or the like. Other insulation materials formed by any acceptable process may be used. In some embodiments, a contact etch stop layer (CESL), not illustrated, is disposed between the ILD 88 and the epitaxial source/drain regions 82, the hard mask 70, and the gate spacers 74.

Subsequently, a planarization process, such as a CMP, may be performed to level the top surface of the ILD 88 with the top surfaces of the dummy gate electrodes 68. In an embodiment, the planarization process is performed using the planarization system 200. The planarization process may also remove the masks 74 on the dummy gate electrodes 68, and portions of the gate seal spacers and the gate spacers 74 along sidewalls of the masks 70. After the planarization process, top surfaces of the dummy gate electrodes 68, the gate spacers 74, and the ILD 88 are level. Accordingly, the top surfaces of the dummy gate electrodes 68 are exposed through the ILD 88.

After planarization, the dummy gate electrodes 68 and portions of the dummy dielectric layer 60 directly underlying the exposed dummy gate electrodes 68 are removed in an etching step(s), so that recesses are formed. In some embodiments, the dummy gate electrodes 68 are removed by an anisotropic dry etch process. For example, the etching process may include a dry etch process using reaction gas(es) that selectively etch dummy gate electrodes 68 without etching the ILD 88 or the gate spacers 74. Each recess exposes a channel region of a respective fin 52. Each channel region is disposed between neighboring pairs of the epitaxial source/drain regions 82. During the removal, the dummy dielectric layer 60 may be used as an etch stop layer when the dummy gate electrodes 68 are etched. The dummy dielectric layer 60 may then be removed after the removal of the dummy gate electrodes 68.

Figure 16B:
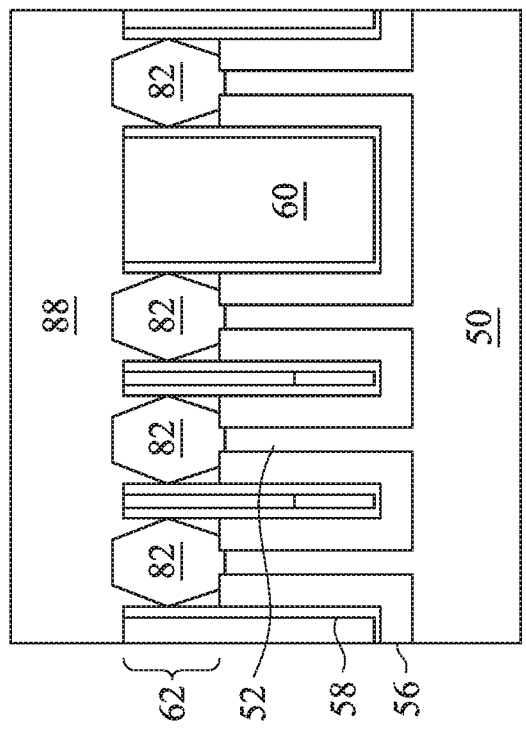
Figure 16A:
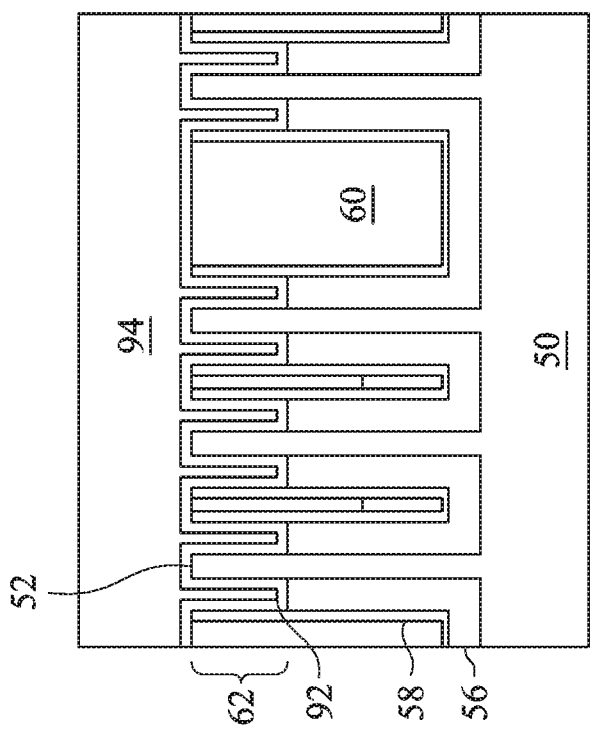
Figure 16C:
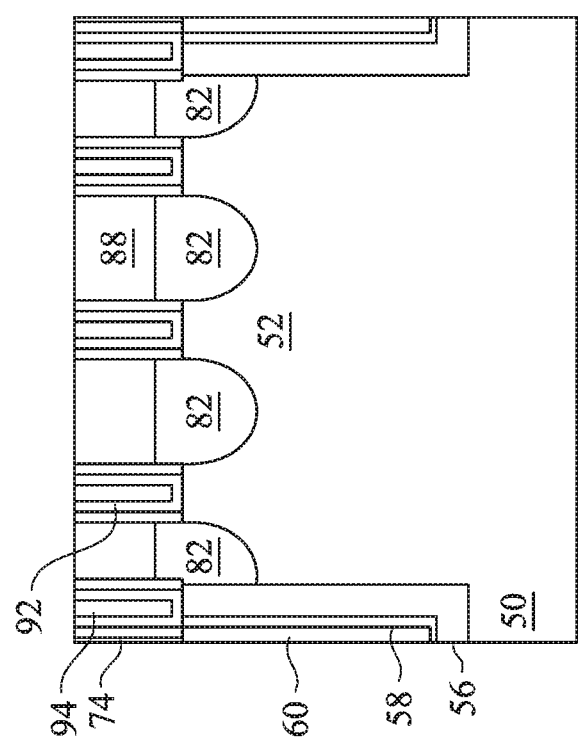

In FIGS. 16A, 16B, and 16C, gate dielectric layers 92 and gate electrodes 94 are formed for replacement gates. Gate dielectric layers 92 are deposited conformally in the recesses, such as on the top surfaces and the sidewalls of the fins 52/dummy fins 62 and on sidewalls of the gate seal spacers 74. The gate dielectric layers 92 may also be formed on top surface of the ILD 88. In accordance with some embodiments, the gate dielectric layers 92 comprise silicon oxide, silicon nitride, or multilayers thereof. In some embodiments, the gate dielectric layers 92 are a high-k dielectric material, and in these embodiments, the gate dielectric layers 92 may have a k value greater than about 7.0, and may include a metal oxide or a silicate of Hf, Al, Zr, La, Mg, Ba, Ti, Pb, and combinations thereof. The formation methods of the gate dielectric layers 92 may include Molecular-Beam Deposition (MBD), ALD, PECVD, and the like.

The gate electrodes 94 are deposited over the gate dielectric layers 92, respectively. The gate electrodes 94 may be a metal-containing material such as TiN, TaN, TaC, Co, Ru, Al, combinations thereof, or multi-layers thereof. For example, although a single gate electrode 94 is illustrated, any number of work function tuning layers may be deposited in the recesses 90. After the filling of the gate electrodes 94, a planarization process, such as a CMP, may be performed to remove the excess portions of the gate dielectric layers 92 and the material of the gate electrodes 94, which excess portions are over the top surface of the ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate" or a "gate stack." The gate and the gate stacks may extend along sidewalls of a channel region of the fins 52 and along sidewalls of the dummy fins 62.

The formation of the gate dielectric layers 92 in the region 50C and the region 50D may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and the gate electrodes 94 in each region may be formed by distinct processes, such that the gate electrodes 94 may be different materials. Various masking steps may be used to mask and expose appropriate regions when using distinct processes.

Figure 17A:
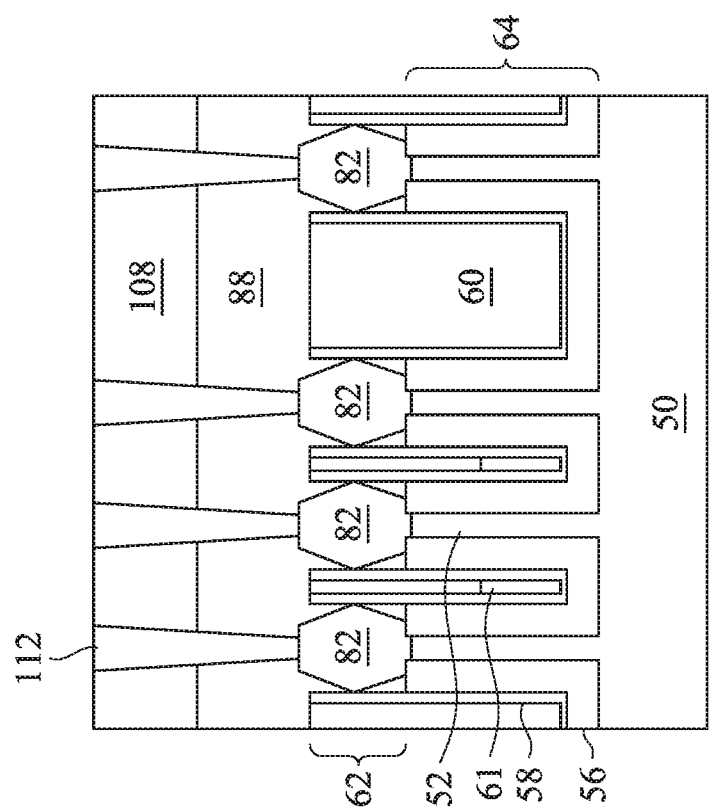
Figure 17B:
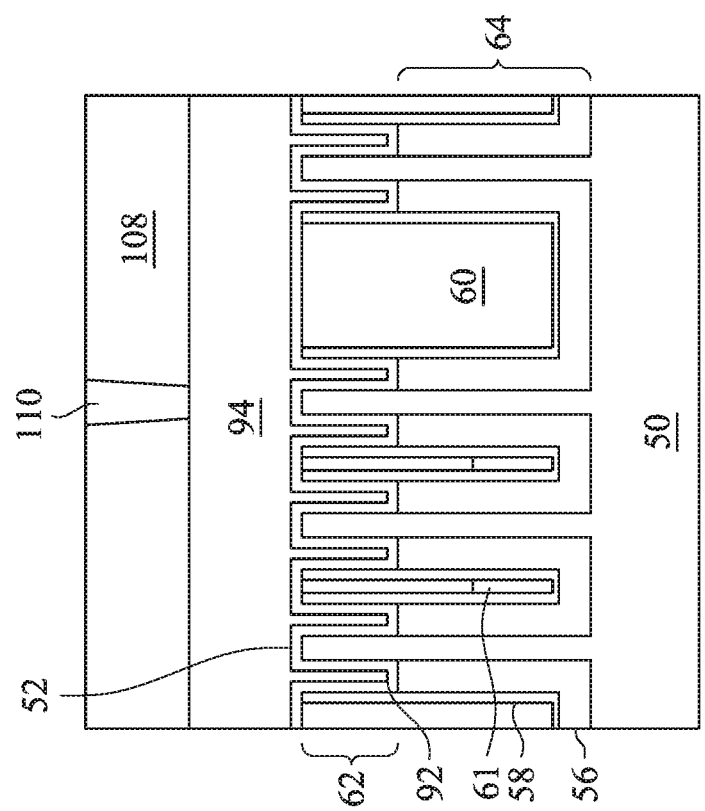
Figure 17C:
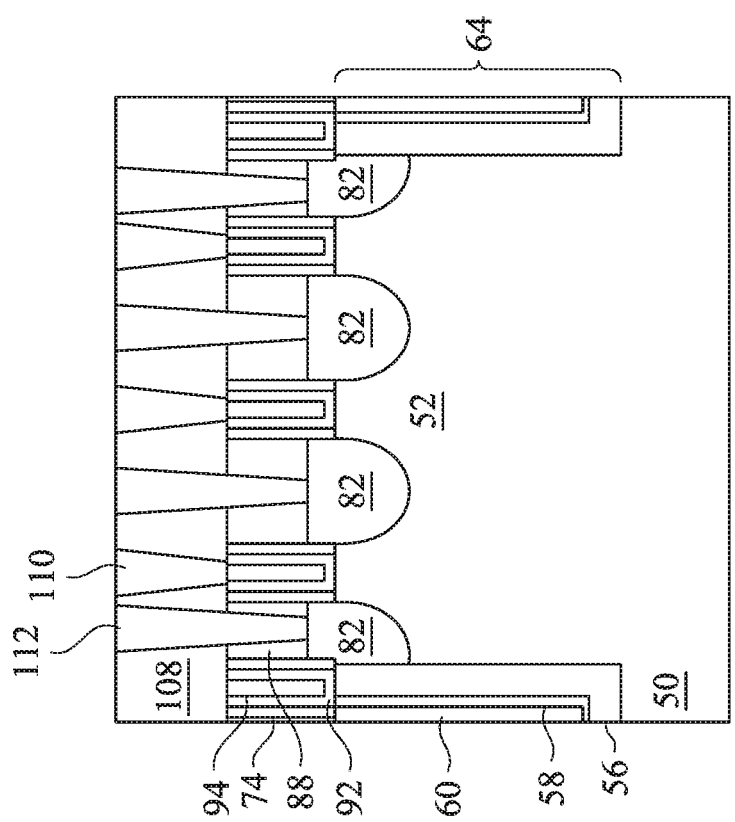
Figure 17E:
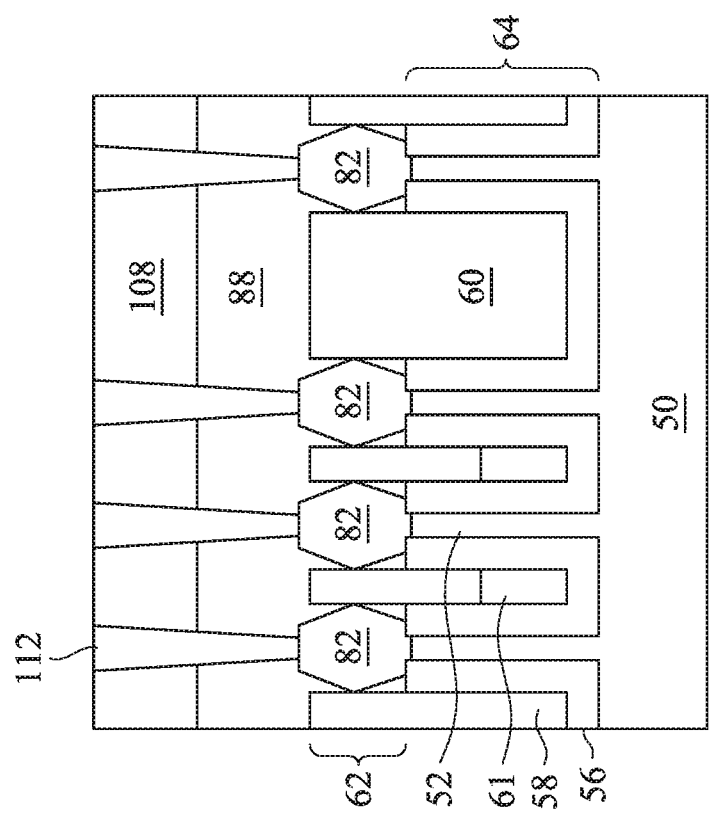
FIGS. 17D, 17E, and 17F illustrate varying views of a device in accordance with some alternative embodiments.
Figure 17D:
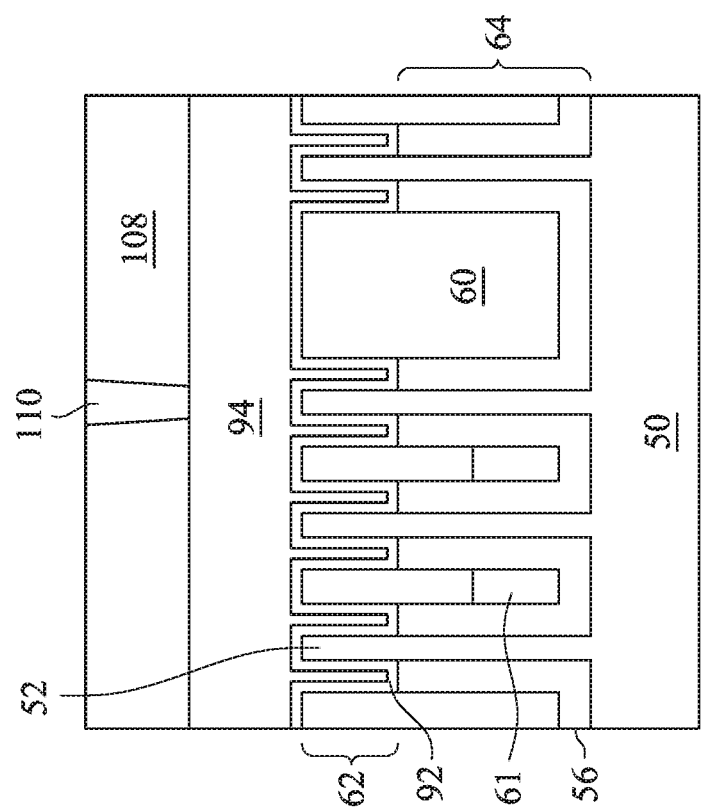
Figure 17F:
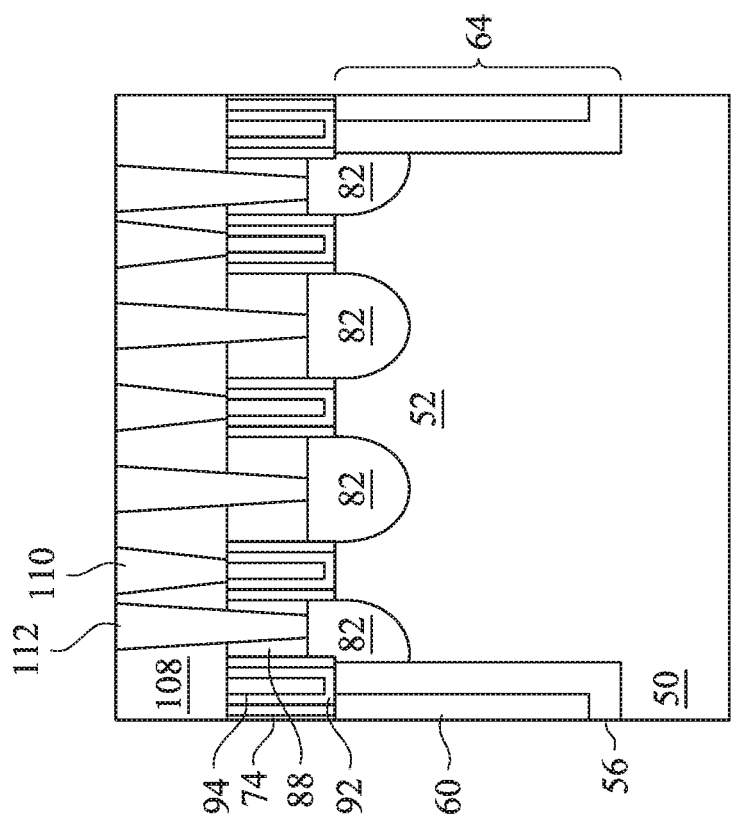

In FIGS. 17A, 17B, and 17C, an ILD 108 is deposited over the ILD 88. In an embodiment, the ILD 108 is a flowable film formed by a flowable CVD method. In some embodiments, the ILD 108 is formed of a dielectric material such as PSG, BSG, BPSG, USG, or the like, and may be deposited by any suitable method, such as CVD and PECVD.

Also in FIGS. 17A, 17B, and 17C, contacts 110 and 112 are formed through the ILD 108 and the ILD 88 using embodiment contact formation processes. In some embodiments, an anneal process may be performed to form a silicide at the interface between the epitaxial source/drain regions 82 and the contacts 112 prior to the contacts 112 being formed. The contact 110 is physically and electrically connected to the gate electrode 94, and the contacts 112 are physically and electrically connected to the epitaxial source/drain regions 82. FIG. 17C illustrate the contacts 110 and 112 in a same cross-section; however, in other embodiments, the contacts 110 and 112 may be disposed in different cross-sections. Further, the position of contacts 110 and 112 in FIGS. 17A, 17B, and 17B are merely illustrative and not intended to be limiting in any way. For example, the contact 110 may be vertically aligned with a semiconductor fin 52 as illustrated or may be disposed at a different location on the gate electrode 94. Furthermore, the contacts 112 may be formed prior to, simultaneously with, or after forming the contacts 110.

FIGS. 17D, 17E, and 17F illustrate a device where the dielectric film 58 is omitted. In such embodiments, the dummy fins 62 are defined by portions of the dielectric film 60 extending above the dielectric film 56. Because the dummy fins 62 is defined by a single film, the dummy fins 62 may have a same material composition throughout. Further, a combination of the dielectric film 56, lower portions of the dielectric film 60, and voids 61 (if present) may provide isolation between adjacent semiconductor fins 52.

Figure 20:
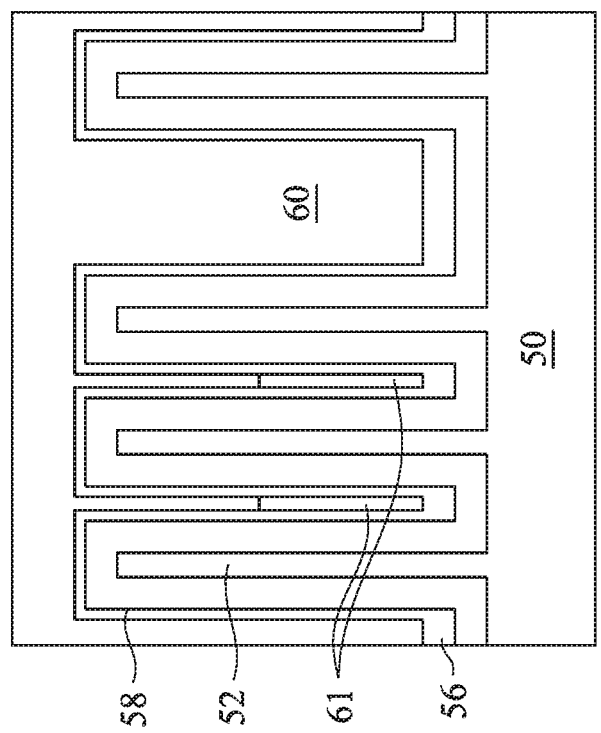
Figure 21:
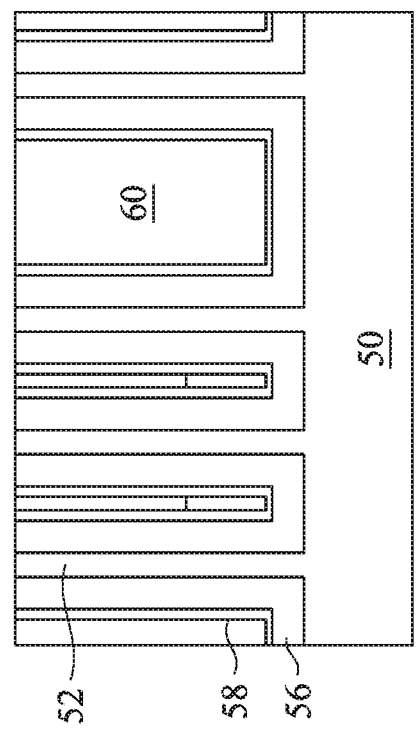
Figure 22:
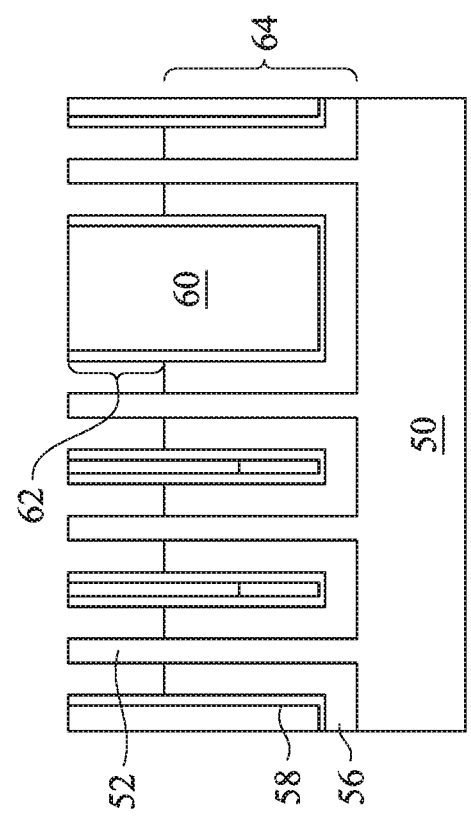

FIGS. 18 through 22 illustrate cross sectional views of intermediary steps of manufacturing a device in accordance with other embodiments. Unlike the embodiments of FIGS. 2 through 9, in FIGS. 18 through 22, the mask layer 54 is removed (e.g., using a suitable planarization or etch back process) prior to the formation of the dielectric film 56. In such embodiments, the dielectric film 56 may be formed directly on a top surface of the semiconductor fins 52 without any intervening mask layers 54. Subsequent processing may be substantially similar to the embodiment of FIGS. 2 through 9 where like reference numerals indicate like elements formed using like processes. For example, in FIG. 19, an optional dielectric film 58 is deposited over the dielectric film 56. In FIG. 20, a dielectric material 60 is deposited over the dielectric film 56 and the dielectric film 58 (if present). The dielectric material 60 is deposited to at least partially fill areas between the semiconductor fins 52, and the dielectric material 60 is further deposited to overfill and cover the dielectric films 56 and 58 (if present). In FIG. 21, a planarization process is applied to the dielectric material 60 to expose top surfaces of the fins 52, the dielectric film 56, and the dielectric film 58 (if present). Although FIG. 21 illustrates the fins 52, the dielectric film 56, the dielectric film 58, and the dielectric material 60 as being co-planar after planarization, in other embodiments, these top surfaces may be non-planar (e.g., as illustrated by FIG. 7B). Subsequently, in FIG. 22, an etch back process is performed on the dielectric film 56 to define semiconductor fins 52 and dummy fins 62 (e.g., comprising upper portions of the dielectric film 58 (if present) and of the dielectric material 60). After the semiconductor fins 52 and the dummy fins 62 are formed (see FIG. 22), additional process steps, similar to those discussed above with respect to FIGS. 10A through 17C may be performed in order to form functional finFET devices. Although FIGS. 18 through 22 illustrate the inclusion of optional dielectric film 58, in other embodiments dielectric film 58 may be excluded and the dielectric material 60 may be deposited directly on the dielectric film 56.

Figure 23:
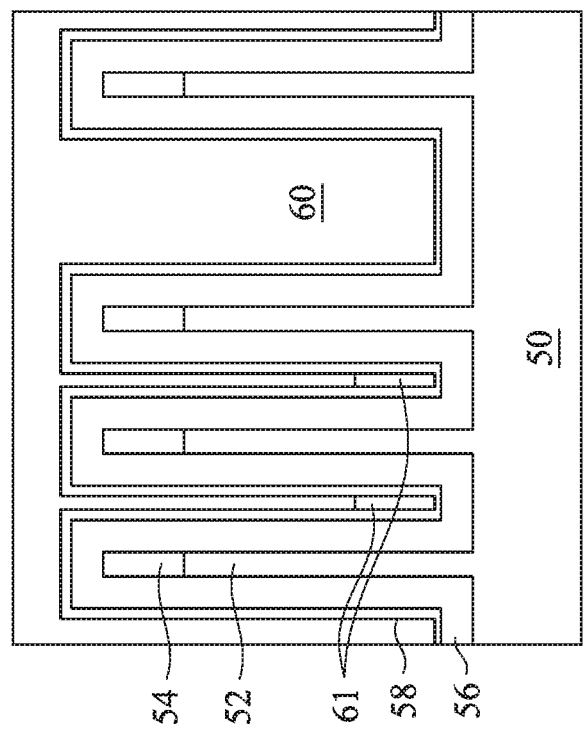
FIGS. 23 through 27, 28A, 28B, and 28C illustrate cross-sectional views of intermediary stages of manufacturing a device in accordance with some alternative embodiments.

FIGS. 23 through 27 illustrate cross sectional views of intermediary steps of manufacturing a device in accordance with other embodiments. FIG. 23 illustrates a cross-sectional at a stage of manufacture similar to FIG. 6 where like reference numerals indicate like elements formed using like processes. Although FIG. 23 illustrates the inclusion of dielectric film 58, dielectric film 58 is optional. In other embodiments, dielectric film 58 is excluded (see e.g., FIGS. 28D, 28E, and 28F).

Figure 24:
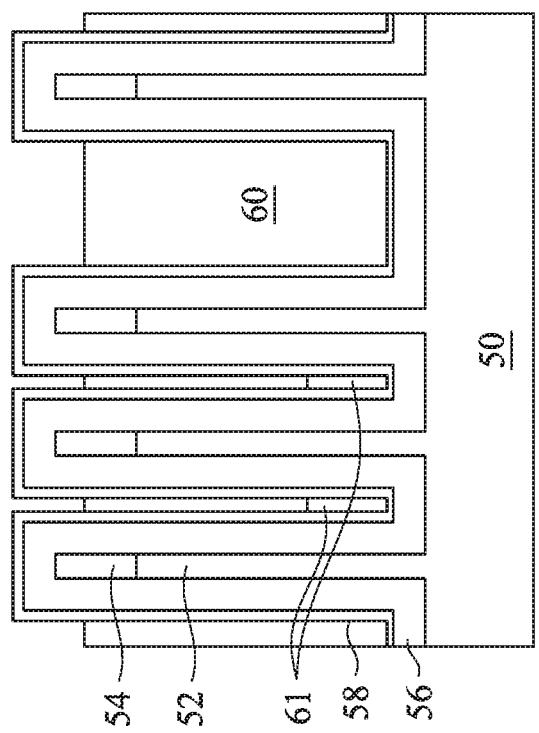
Figure 25:
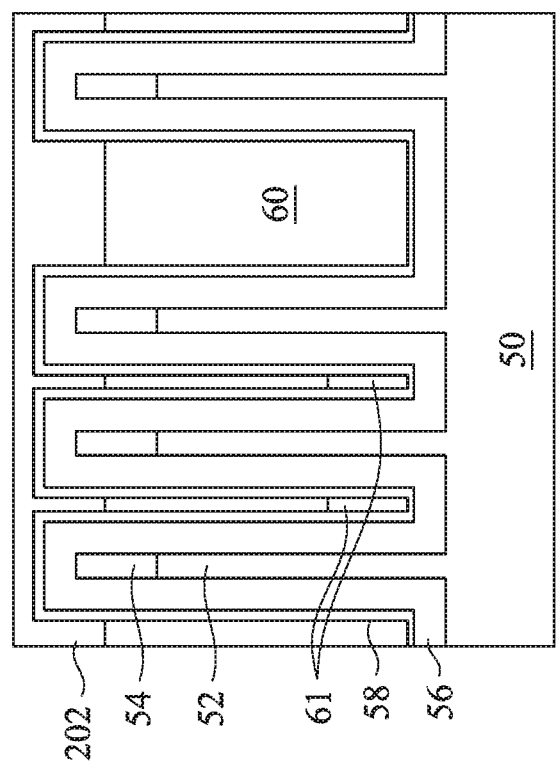

In FIG. 24, an etch back process is used to pattern the dielectric material 60 such that the dielectric film 58 (if present) or the dielectric film 56 (if optional dielectric film 58 is excluded) is exposed. In FIG. 25, a dielectric material 202 is deposited over the dielectric film 56 and dielectric film 58 (if present). In some embodiments, the dielectric material 202 may be deposited using a flowable deposition process, a spin-on process, or the like. The dielectric material 202 may comprise a carbon-containing dielectric film (e.g., a carbon-containing oxide, such as, SiOC), a metal-containing dielectric film (e.g., a metal-containing oxide, such as, a combination of SiO and a metal), or the like. In some embodiments, a carbon and/or metal percentage by weight of the dielectric material 60 is less than a corresponding carbon/metal percentage by weight of the dielectric liner 58. For example, the dielectric liner 58 may comprise SiOC with more than 10% by weight of carbon, and the dielectric material 60 may comprise SiOC with less than 10% by weight of carbon. A material composition of the dielectric material 202 and the dielectric material 60 may be the same or different. For example, the dielectric material 202 and the dielectric material 60 may have a same percentage by weight of carbon/metal or a different percentage by weight of carbon/metal. In some embodiments, the dielectric material 202 provides additional protection for and encapsulates the dielectric material 60.

Figure 26:
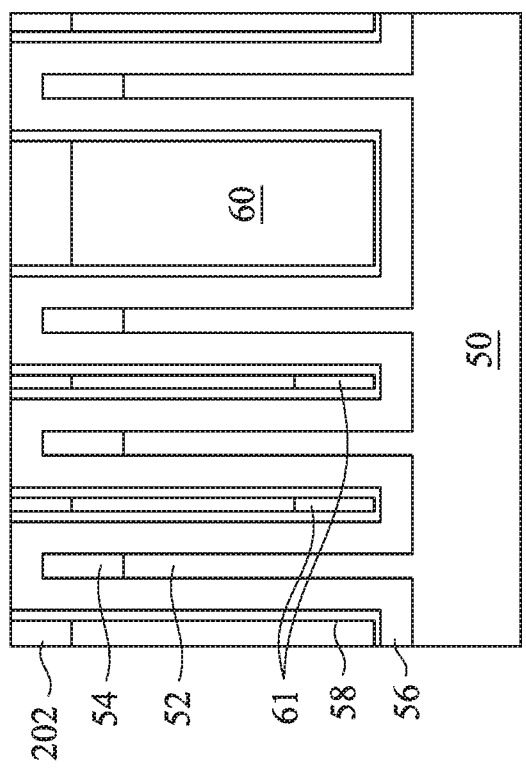
Figure 27:
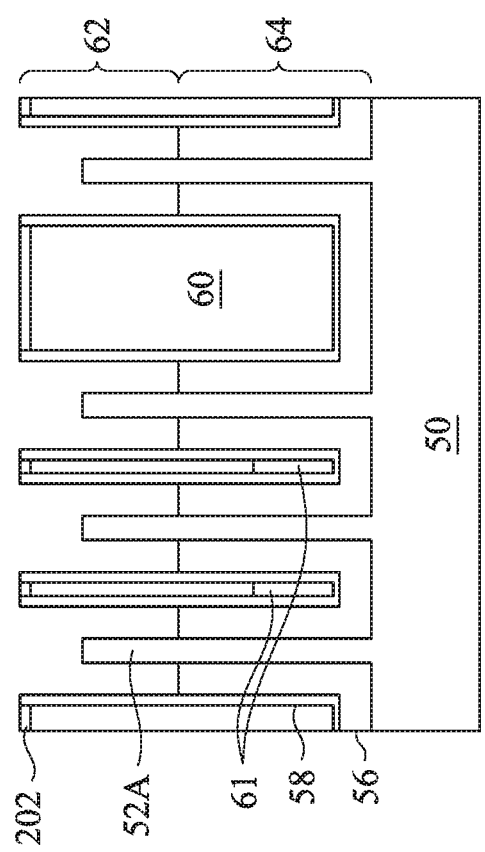

In FIG. 26, a planarization (e.g., a CMP and/or etch back process (e.g., a dry etching process)) is used to expose upper surfaces of the dielectric film 56. In some embodiments, exposing the dielectric film 56 results in upper surfaces of the dielectric material 202 and the dielectric film 56 being substantially coplanar.

In FIG. 27, an additional etch back process is performed on the dielectric liner 56. The dielectric liner 56 is recessed such that semiconductor fins 52 and dummy fins 62 protrude above top surfaces of the etched dielectric liner 56. After the dielectric liner 56 is recessed, the hard mask 54 may also be removed from top surfaces of the fins 52 using, for example, an acceptable etching process. In some embodiments, after recessing, a height of the semiconductor fins 52 may be less than a height of the dummy fins 62. Dummy fins 62 are made of upper portions of the dielectric liner 58 (if present), upper portions of the dielectric material 60, and remaining portions of the dielectric material 202. Thus, dummy fins 62 may have a different material composition than semiconductor fins 52 and may be insulating fins. Further, remaining portions of the dielectric liner 56, lower portions of the dielectric liner 58, and lower portions of the dielectric material 60 (referred to collectively as isolation region 64) provide electrical isolation between adjacent fins 52 and may further provide STI regions between the fins 52 such that an separate STI region need not be formed.

Figure 31:
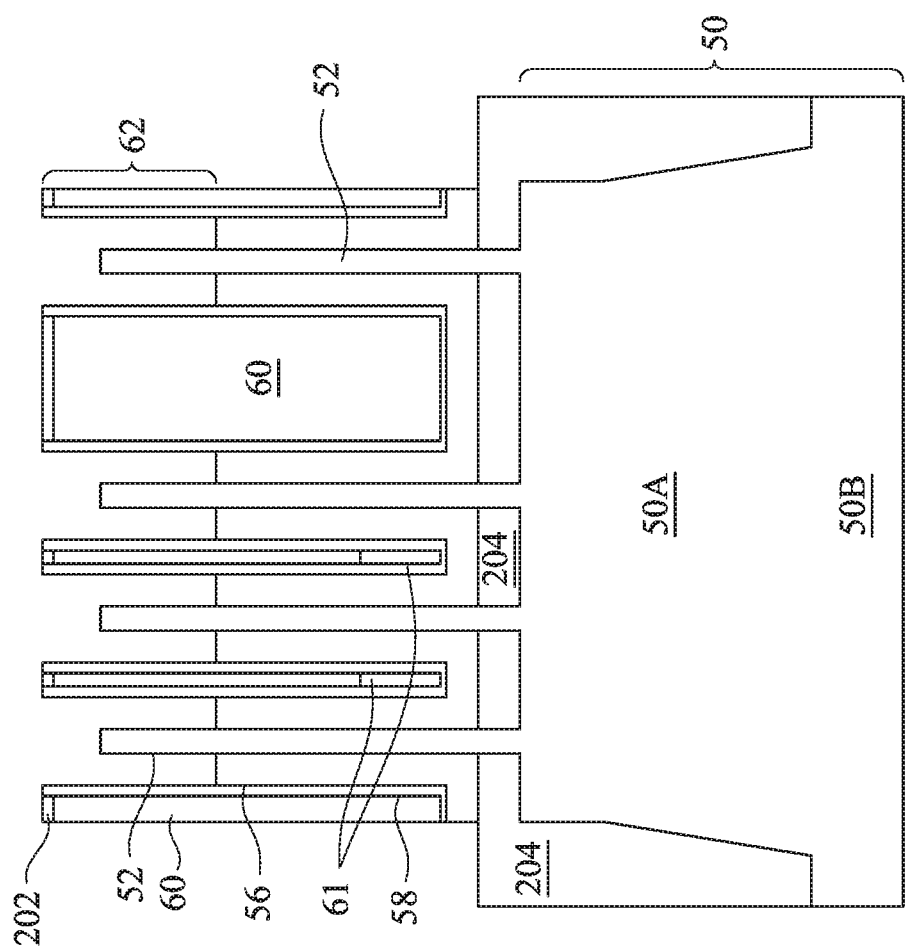
FIGS. 31, 32A, 32B, and 32C illustrate cross-sectional views of intermediary stages of manufacturing a device in accordance with some alternative embodiments.
Figure 32B:
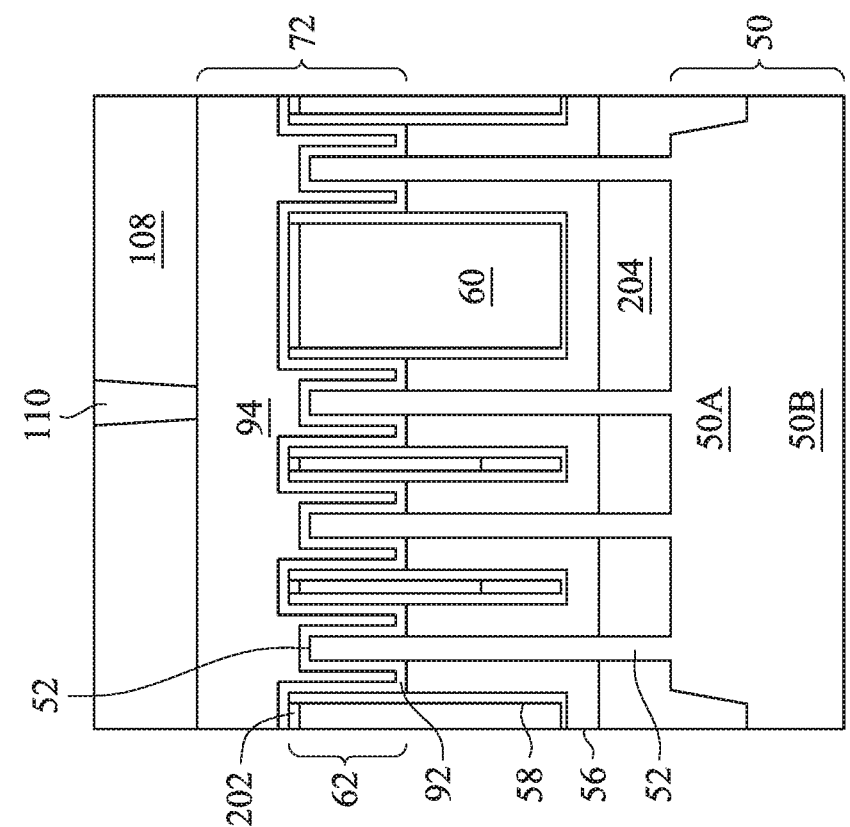
Figure 32A:
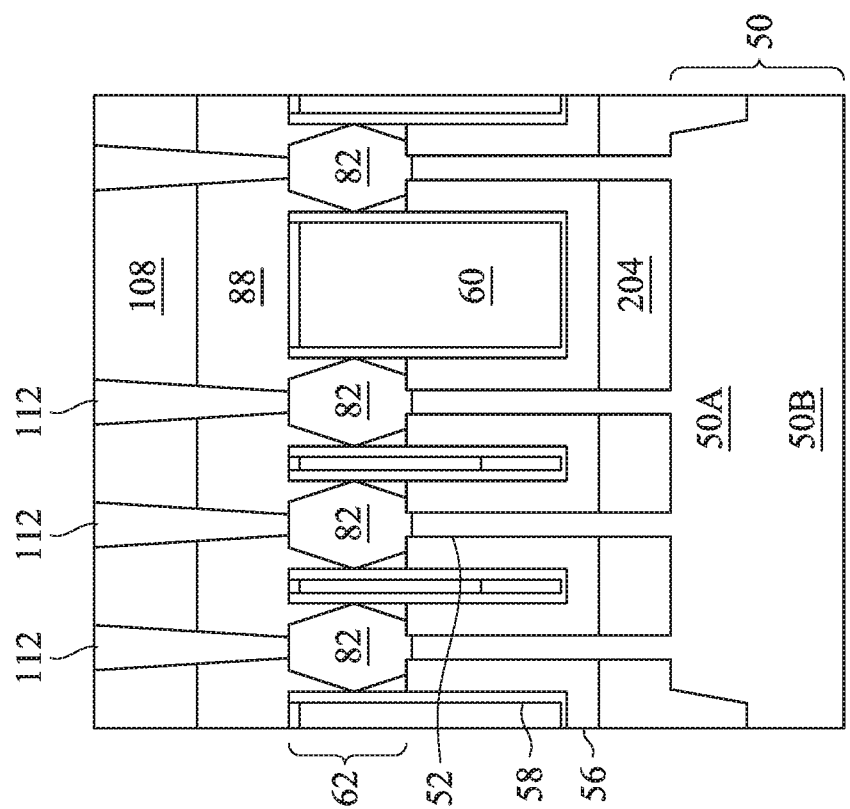
Figure 32C:
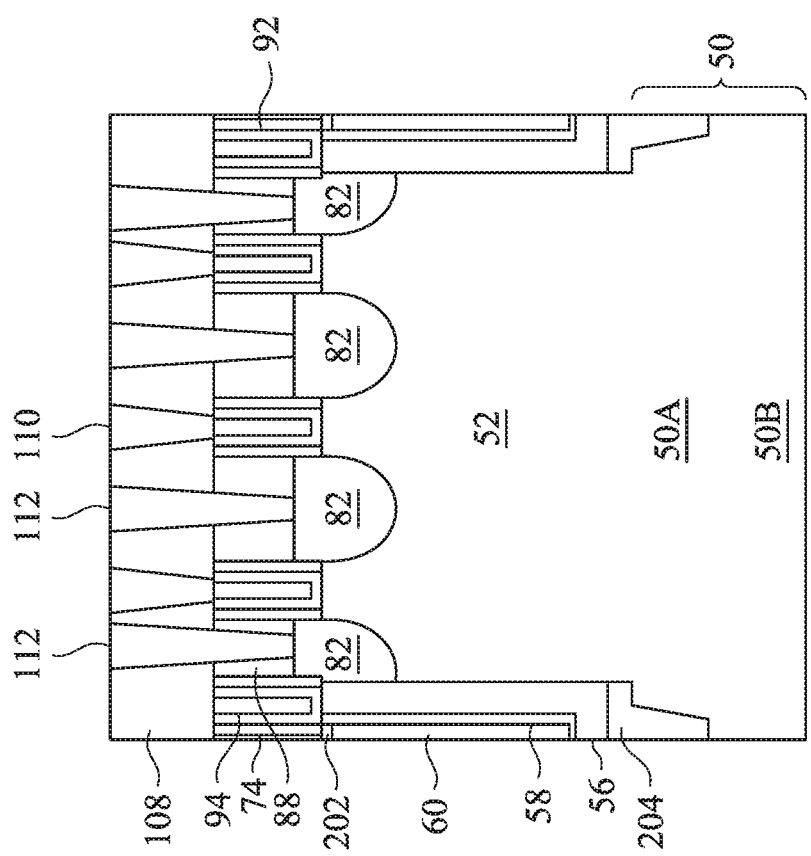

In other embodiments, a separate STI region is formed (e.g., between a bottom surface of the dielectric film 56 and the substrate 50). For example, FIG. 31 illustrates an embodiment where a separate STI region 204 is formed between bottoms of the dielectric film 56 and the substrate 50 (labeled as 50A). In the embodiment of FIGS. 30A, 30B, and 30C, individual fins 52 may be connected by a mesa 50A (sometimes referred to as a crown). Mesa 50A is a portion of the substrate 50. Multiple fins 52 may extend from a single mesa 50A, which is connected to a lower portion of the substrate 50 (labeled as 50B). Mesa 50A may provide improved structural stability in the formation of high aspect ratio fins (e.g., fins 52). STI region 204 may be formed to extend along lower portions of the fins 52 as well as along sidewalls of the mesa 50A. Although subsequent figures illustrate embodiments where the mesa 50A and STI region 204 are excluded, this is for ease of illustration only. It should be recognized that the embodiment of FIG. 31 may be incorporated into subsequent process steps and combined with subsequent descriptions. For example, FIGS. 32A, 32B, and 32C illustrate a finFET device after further processing, e.g., using similar processes as described below in FIGS. 10A through 17C where like reference numerals indicate like elements formed using like processes, incorporating a separate STI region and the dielectric film 202 as described with respect to FIG. 31. FIG. 32A is taken along reference cross-section A-A of FIG. 1; FIG. 32B is taken along reference cross-section B-B of FIG. 1; and FIG. 32C is taken along reference cross-section C-C of FIG. 1.

In some embodiments, etching back the dielectric liner 56 may use a selective etching process which selectively etches the dielectric liner 56 at a faster rate than the dielectric liner 58, the dielectric material 60, and the fins 52. Such selective etching may be enabled, for example, by the inclusion of carbon and/or a metal in the dielectric liner 58 and the dielectric material 60.

Figure 18:
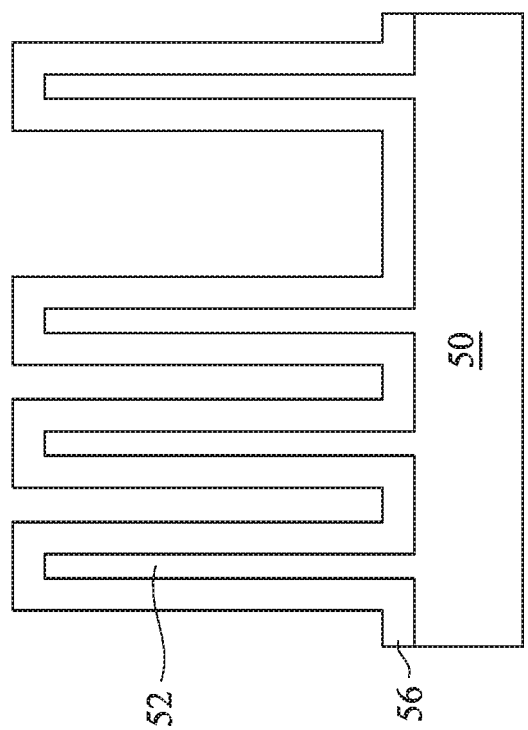
FIGS. 18 through 22 illustrate cross-sectional views of intermediary stages of manufacturing a device in accordance with some alternative embodiments.
Figure 19:
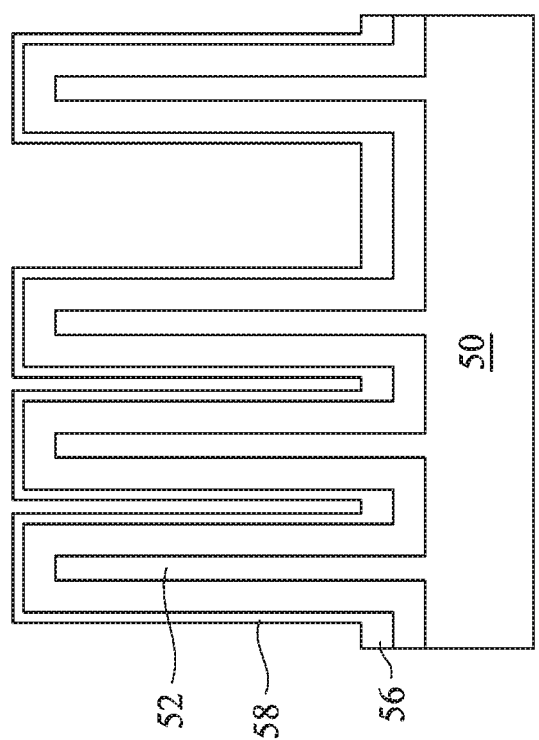

After the semiconductor fins 52 and the dummy fins 62 are formed (see FIG. 27), additional process steps, similar to those discussed above with respect to FIGS. 10A through 17C may be performed in order to form functional finFET devices. The resulting structures are illustrated in FIG. 28A (illustrating a device along a similar cross section as A-A in FIG. 1), 28B (illustrating a device along a similar cross section as A-A in FIG. 1), and 28C (illustrating a device along a similar cross section as A-A in FIG. 1) where like reference numerals indicate like elements formed using like processes. Further, because dummy fins 62 extend above the semiconductor fins 62, the dummy fins 62 may be even more effective in reducing the merging of adjacent source/drain epitaxial regions 82. Although FIGS. 23 through 27 illustrate the removal of the mask layer 54 after forming the dielectric material 202, in other embodiments, the mask layer 54 may be removed prior to the deposition of the dielectric film 56 (e.g., as depicted in FIG. 18). In such embodiments, the dielectric film 56 may be formed directly on sidewalls and a top surface of the fins 52 (see FIG. 18).

Figure 28B:
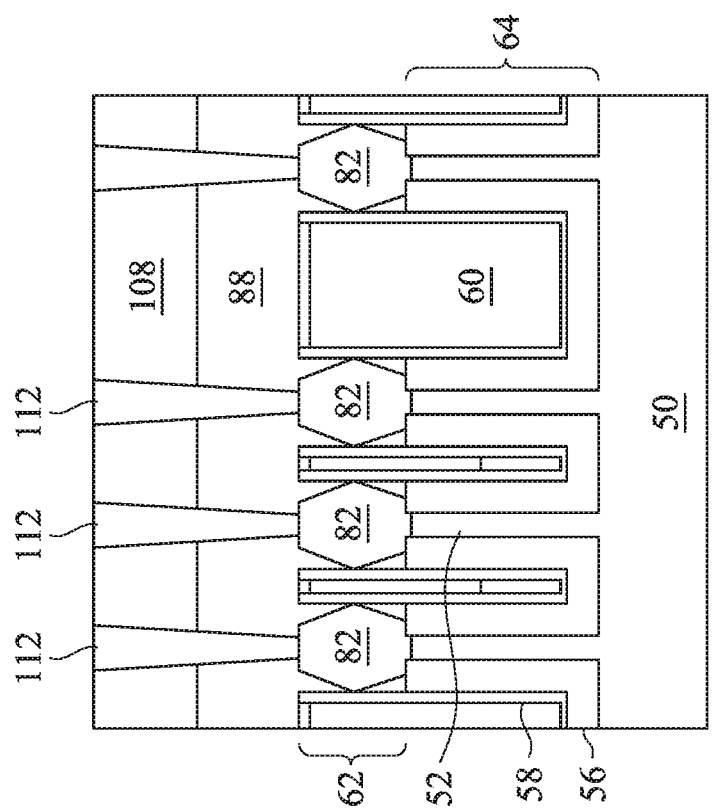
Figure 28A:
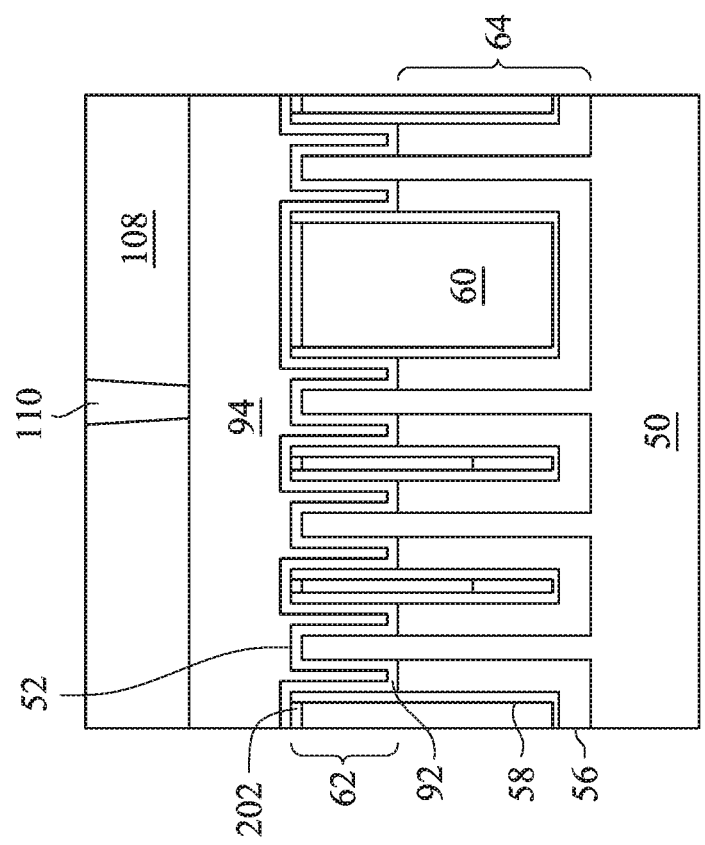
Figure 28C:
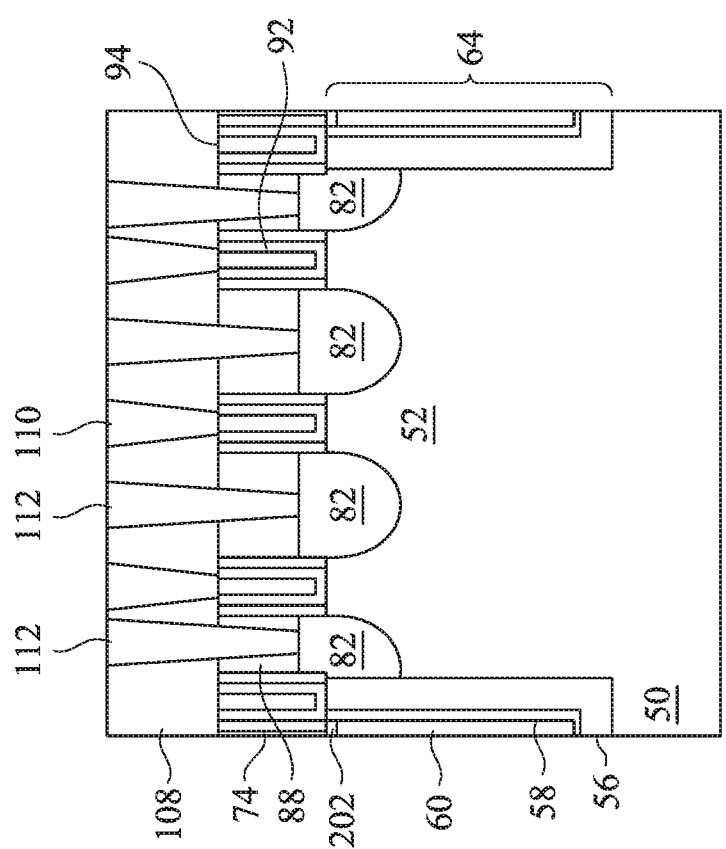
Figure 28E:
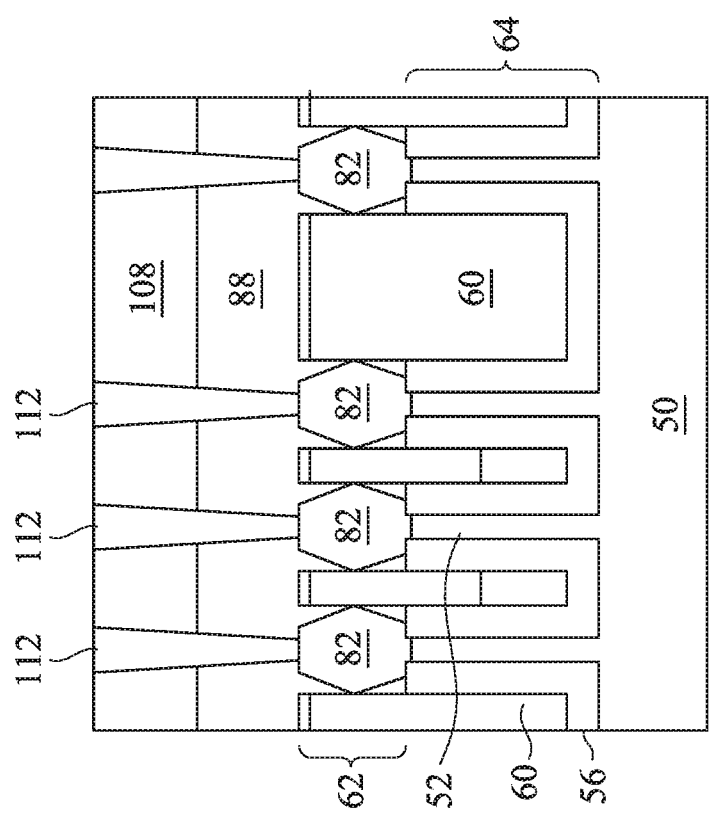
FIGS. 28D, 28E, and 28F illustrate varying views of a device in accordance with some alternative embodiments.
Figure 28D:
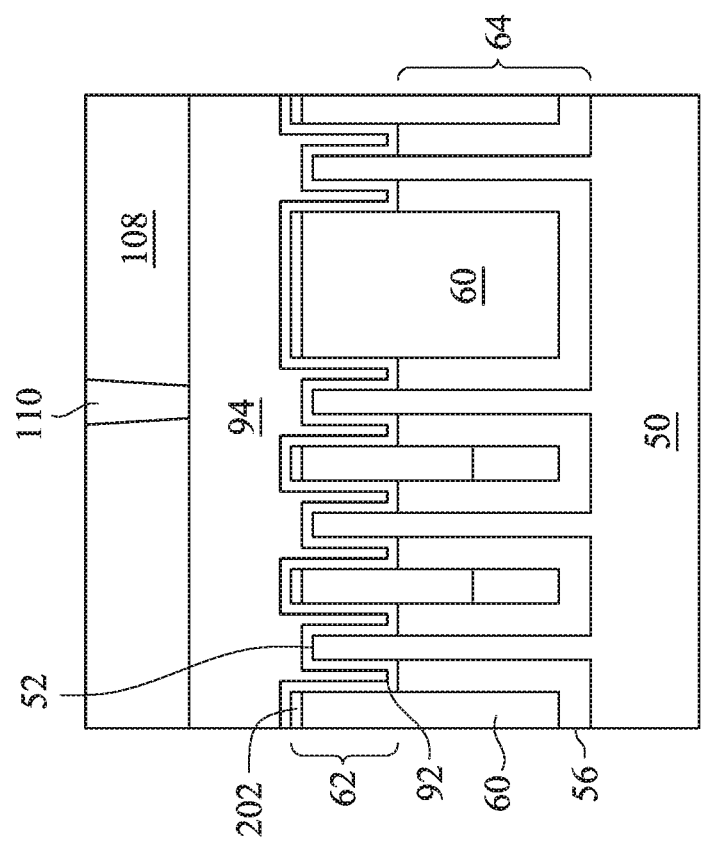
Figure 28F:
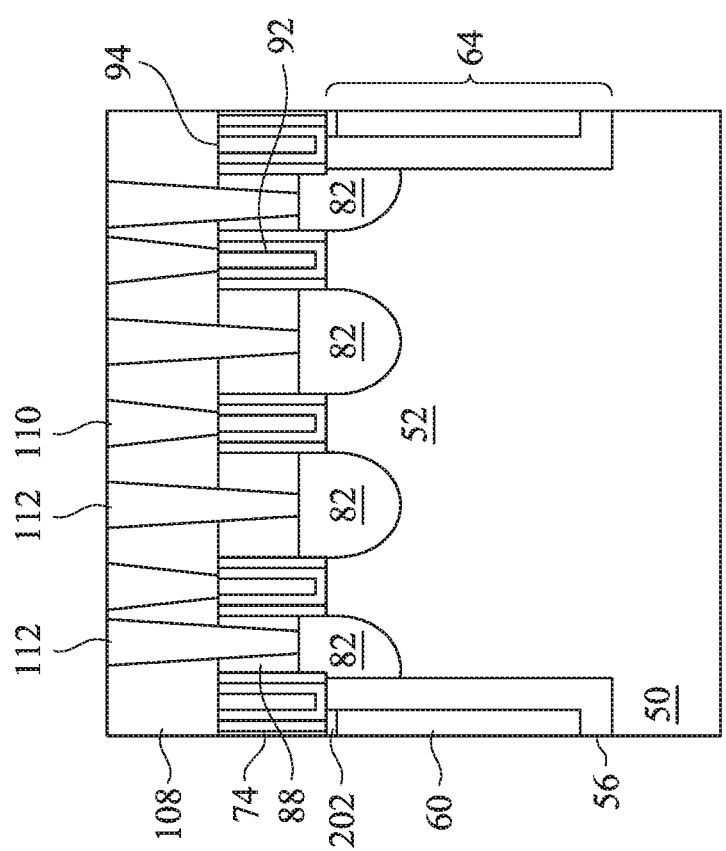

FIGS. 28D, 28E, and 28F illustrate a device similar to the device depicted in FIGS. 28A, 28B, and 28C where the dielectric film 58 is omitted. In FIGS. 28D, 27E, and 27F, like reference numerals indicate like elements formed by like processes as FIGS. 28A, 28B, and 28C. In such embodiments, the dummy fins 62 are defined by portions of the dielectric film 60 extending above the dielectric film 56 and the dielectric material 202. Further, a combination of the dielectric film 56, lower portions of the dielectric film 60, and voids 61 (if present) may provide isolation between adjacent semiconductor fins 52.

In accordance with an embodiment, a method includes depositing a first dielectric film over and along sidewalls of a semiconductor fin, the semiconductor fin extending upwards from a semiconductor substrate; depositing a dielectric material over the first dielectric film; recessing the first dielectric film below a top surface of the semiconductor fin to define a dummy fin, the dummy fin comprising an upper portion of the dielectric material; and forming a gate stack over and along sidewalls of the semiconductor fin and the dummy fin. In an embodiment, depositing the dielectric material comprises covering a top surface of the first dielectric film with the dielectric material, the method further comprising planarizing the dielectric material to expose the first dielectric film. In an embodiment, depositing the dielectric material comprises defining a void under the dielectric material between the semiconductor fin and a second semiconductor fin. In an embodiment, recessing the first dielectric film comprises etching the first dielectric film at a faster rate than the dielectric material. In an embodiment, the method further includes prior to depositing the dielectric material, depositing a second dielectric film over the first dielectric film, and wherein the dummy fin comprises an upper portion formed of the second dielectric film. In an embodiment, the method further includes prior to recessing the first dielectric film, recessing the dielectric material below a topmost surface of the first dielectric film; depositing a second dielectric material over the dielectric material and the first dielectric film; and planarizing the second dielectric material to expose the first dielectric film. In an embodiment, the method further includes patterning the semiconductor substrate using a mask layer to define the semiconductor fin, wherein the first dielectric film is deposited over and along sidewalls of the mask layer. In an embodiment, the method further includes patterning the semiconductor substrate using a mask layer to define the semiconductor fin; and prior to depositing the first dielectric film, removing the mask layer.

In accordance with an embodiment, a device includes a first semiconductor fin and a second semiconductor fin extending upwards from a semiconductor substrate; an isolation region comprising a first dielectric film and disposed between the first semiconductor fin and the second semiconductor fin; a dummy fin extending upwards from the isolation region, wherein the dummy fin comprises a first dielectric material extending from below a topmost surface of the first dielectric film to above the topmost surface of the first dielectric film; and a gate stack disposed over and extending along sidewalls of the first semiconductor fin, over and along sidewalls of the second semiconductor fin, and over and along sidewalls of the dummy fin. In an embodiment, the first dielectric film comprises silicon oxide, and wherein the first dielectric material comprises a carbon containing oxide, a metal containing oxide, or a combination thereof. In an embodiment, the dummy fin comprises a second dielectric film disposed between the first dielectric film and the first dielectric material. In an embodiment, a carbon percentage by weight of the second dielectric film is greater than a carbon percentage by weight of the first dielectric material. In an embodiment, a metal percentage by weight of the second dielectric film is greater than a metal percentage by weight of the first dielectric material. In an embodiment, the dummy fin further comprises a second dielectric material covering a top surface of the first dielectric material. In an embodiment, top surfaces of the dummy fin and the first semiconductor fin are substantially level. In an embodiment, the dummy fin extends higher than the first semiconductor fin. In an embodiment, the device further includes a semiconductor mesa connecting the first semiconductor fin and the second semiconductor fin, wherein the isolation region further comprises a third dielectric material disposed between the first dielectric film and the semiconductor mesa, and wherein the third dielectric material further extends along sidewalls of the semiconductor mesa. In an embodiment, the device further includes a second dummy fin disposed on an opposing side of the first semiconductor fin as the dummy fin, wherein the second dummy fin extends upwards from the isolation region, wherein the second dummy fin comprises the first dielectric material; and a source/drain region disposed between the dummy fin and the second dummy fin.

In accordance with an embodiment, a method includes depositing a first dielectric film over and along sidewalls of a plurality of semiconductor fins; depositing a dielectric material over the first dielectric film, wherein the dielectric material comprises carbon, metal, or a combination thereof, and wherein the dielectric material is deposited between each of the plurality of semiconductor fins; planarizing the dielectric material to expose the first dielectric film; etching the first dielectric film using an etchant that etches the first dielectric film at a faster rate than the dielectric material, wherein etching the first dielectric film defines a plurality of dummy fins extending above a top surface of the first dielectric film, and wherein the plurality of dummy fins comprises at least a portion of the dielectric material; and forming a gate stack over and along sidewalls of the plurality of semiconductor fins and over and along sidewalls of the plurality of dummy fins. In an embodiment, the method further includes prior to depositing the dielectric material, depositing a second dielectric film over the first dielectric film, wherein the second dielectric film comprises carbon, metal or a combination thereof, and wherein the plurality of dummy fins comprises at least a portion of the second dielectric film.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
depositing a first dielectric film over and along sidewalls of a semiconductor fin, the semiconductor fin extending upwards from a semiconductor substrate;
depositing a dielectric material over the first dielectric film;
recessing the first dielectric film below a top surface of the semiconductor fin to define a dummy fin, the dummy fin comprising an upper portion of the dielectric material, wherein recessing the first dielectric film comprises etching the first dielectric film at a faster rate than the dielectric material; and
forming a gate stack over and along sidewalls of the semiconductor fin and the dummy fin.

2. The method of claim 1 wherein depositing the dielectric material comprises covering a top surface of the first dielectric film with the dielectric material, the method further comprising planarizing the dielectric material to expose the first dielectric film.

3. The method of claim 2, wherein depositing the dielectric material comprises defining a void under the dielectric material between the semiconductor fin and a second semiconductor fin.

4. The method of claim 1 further comprising prior to depositing the dielectric material, depositing a second dielectric film over the first dielectric film, and wherein the dummy fin comprises an upper portion formed of the second dielectric film.

5. The method of claim 1 further comprising:
prior to recessing the first dielectric film, recessing the dielectric material below a topmost surface of the first dielectric film;
depositing a second dielectric material over the dielectric material and the first dielectric film; and
planarizing the second dielectric material to expose the first dielectric film.

6. The method of claim 1 further comprising patterning the semiconductor substrate using a mask layer to define the semiconductor fin, wherein the first dielectric film is deposited over and along sidewalls of the mask layer.

7. The method of claim 1 further comprising:
patterning the semiconductor substrate using a mask layer to define the semiconductor fin; and
prior to depositing the first dielectric film, removing the mask layer.

8. A device comprising:
a first semiconductor fin and a second semiconductor fin extending upwards from a semiconductor substrate;
an isolation region comprising a first dielectric film and disposed between the first semiconductor fin and the second semiconductor fin;
a dummy fin extending upwards from the isolation region, wherein the dummy fin comprises:
a first dielectric material extending from below a topmost surface of the first dielectric film to above the topmost surface of the first dielectric film; and
a second dielectric film disposed between the first dielectric film and the first dielectric material; and
a gate stack disposed over and extending along sidewalls of the first semiconductor fin, over and along sidewalls of the second semiconductor fin, and over and along sidewalls of the dummy fin.

9. The device of claim 8, wherein the first dielectric film comprises silicon oxide, and wherein the first dielectric material comprises a carbon containing oxide, a metal containing oxide, or a combination thereof.

10. The device of claim 8, wherein a carbon percentage by weight of the second dielectric film is greater than a carbon percentage by weight of the first dielectric material.

11. The device of claim 8, wherein a metal percentage by weight of the second dielectric film is greater than a metal percentage by weight of the first dielectric material.

12. The device of claim 8, wherein the dummy fin further comprises a third dielectric material covering a top surface of the first dielectric material.

13. The device of claim 8, wherein top surfaces of the dummy fin and the first semiconductor fin are substantially level.

14. The device of claim 8, wherein the dummy fin extends higher than the first semiconductor fin.

15. The device of claim 8 further comprising a semiconductor mesa connecting the first semiconductor fin and the second semiconductor fin, wherein the isolation region further comprises a third dielectric material disposed between the first dielectric film and the semiconductor mesa, and wherein the third dielectric material further extends along sidewalls of the semiconductor mesa.

16. The device of claim 8 further comprising:
a second dummy fin disposed on an opposing side of the first semiconductor fin as the dummy fin, wherein the second dummy fin extends upwards from the isolation region, wherein the second dummy fin comprises the first dielectric material; and
a source/drain region disposed between the dummy fin and the second dummy fin.

17. A method comprising:
depositing a first dielectric film over and along sidewalls of a plurality of semiconductor fins;
depositing a dielectric material over the first dielectric film, wherein the dielectric material comprises carbon, metal, or a combination thereof, and wherein the dielectric material is deposited between each of the plurality of semiconductor fins;
planarizing the dielectric material to expose the first dielectric film;
etching the first dielectric film using an etchant that etches the first dielectric film at a faster rate than the dielectric material, wherein etching the first dielectric film defines a plurality of dummy fins extending above a top surface of the first dielectric film, and wherein the plurality of dummy fins comprises at least a portion of the dielectric material; and
forming a gate stack over and along sidewalls of the plurality of semiconductor fins and over and along sidewalls of the plurality of dummy fins.

18. The method of claim 17 further comprising prior to depositing the dielectric material, depositing a second dielectric film over the first dielectric film, wherein the second dielectric film comprises carbon, metal or a combination thereof, and wherein the plurality of dummy fins comprises at least a portion of the second dielectric film.

19. The method of claim 18 further comprising planarizing the second dielectric film to expose the first dielectric film.

20. The method of claim 17 further comprising forming a dielectric cap on a top surface of the first dielectric film, wherein the plurality of dummy fins comprises the dielectric cap.

* * * * *